United States Patent
Smith et al.

(10) Patent No.: US 11,150,291 B1
(45) Date of Patent: Oct. 19, 2021

(54) FUNCTIONAL RELIABILITY ASSESSMENT FOR INSULATED POWER CABLE SYSTEMS

(71) Applicant: UNDERGROUND SYSTEMS, INC., Bethel, CT (US)

(72) Inventors: Robert F. Smith, Southbury, CT (US); Charles J. Wills, Monroe, CT (US); Duncan C. Breese, New Milford, CT (US); Paul A. Alex, Fairfiled, CT (US)

(73) Assignee: Underground Systems, Inc., Bethel, CT (US)

( * ) Notice: Subject to any disclaimer, the term of this patent is extended or adjusted under 35 U.S.C. 154(b) by 0 days.

(21) Appl. No.: 17/320,860

(22) Filed: May 14, 2021

(51) Int. Cl.
| | |
|---|---|
| *H01H 21/12* | (2006.01) |
| *G01R 31/12* | (2020.01) |
| *H01B 9/02* | (2006.01) |
| *H01B 7/18* | (2006.01) |
| *G01R 31/00* | (2006.01) |

(52) U.S. Cl.
CPC ....... *G01R 31/1272* (2013.01); *G01R 31/008* (2013.01); *H01B 7/18* (2013.01); *H01B 9/02* (2013.01)

(58) Field of Classification Search
CPC ...... G01R 31/127; G01R 31/50; G01R 31/52; G01R 31/008; G01R 31/302; G01R 31/2879
USPC ......................................................... 324/551
See application file for complete search history.

(56) References Cited

U.S. PATENT DOCUMENTS

| | | | | |
|---|---|---|---|---|
| 5,117,191 A | * | 5/1992 | Saigo ................. | G01R 31/1272 324/551 |
| 5,218,307 A | * | 6/1993 | Hiller ..................... | G01R 31/52 324/541 |
| 6,538,450 B2 | * | 3/2003 | Bussinger ............ | G01R 31/083 324/516 |
| 8,502,542 B2 | * | 8/2013 | Couture ............... | G01R 31/085 324/521 |
| 2003/0098694 A1 | * | 5/2003 | Fujita ................... | H02H 1/0015 324/541 |
| 2016/0238648 A1 | * | 8/2016 | Stechemesser ........ | G01R 31/14 |
| 2021/0072302 A1 | * | 3/2021 | Frohne ................... | G01R 31/52 |

OTHER PUBLICATIONS

U.S. Appl. No. 17/323,363, Robert F. Smith, unpublished.

* cited by examiner

*Primary Examiner* — Thang X Le
(74) *Attorney, Agent, or Firm* — Haug Partners LLP

(57) ABSTRACT

The functional reliability of a cable shield system for a high voltage cable circuit is determined by electrically isolating a segment of the conductive shield from ground along the circuit length and supplying a test voltage of gradually increasing amplitude to the isolated shield segment. Current flows in the shield segment and a connected shield voltage limiter (SVL) in response to the supplied test voltage. The current through the SVL is monitored; and the operational integrity of the shield system is determined as a function of the voltage across and the monitored current through the SVL. Current flow is monitored by sensing the heat dissipated by the SVL included in the link box to which the shield segment is connected. Information representing the voltage across and monitored current through the SVL are transmitted to a remote location whereat the operational integrity of the SVL is determined.

30 Claims, 17 Drawing Sheets

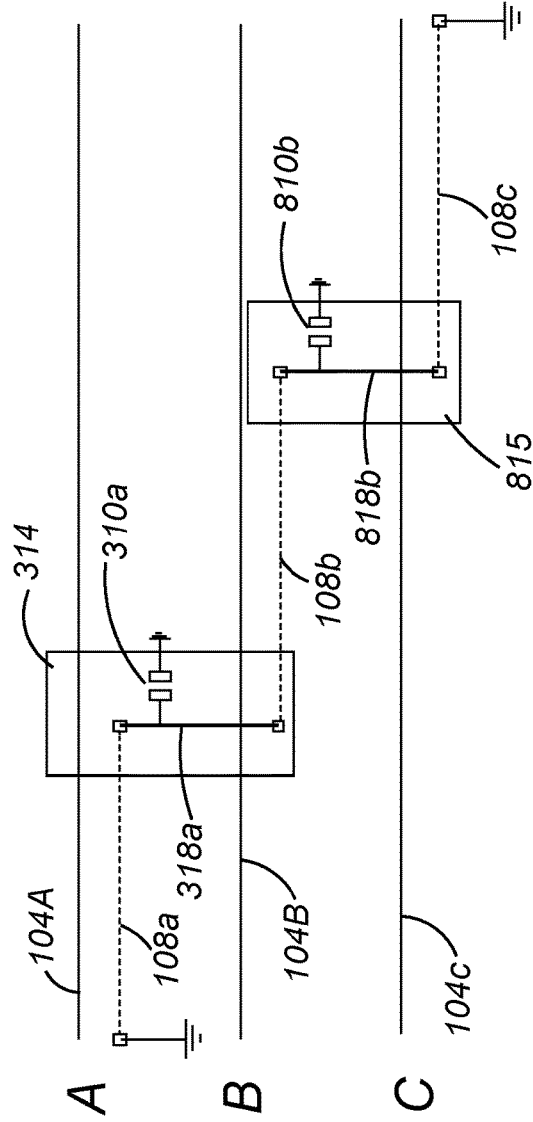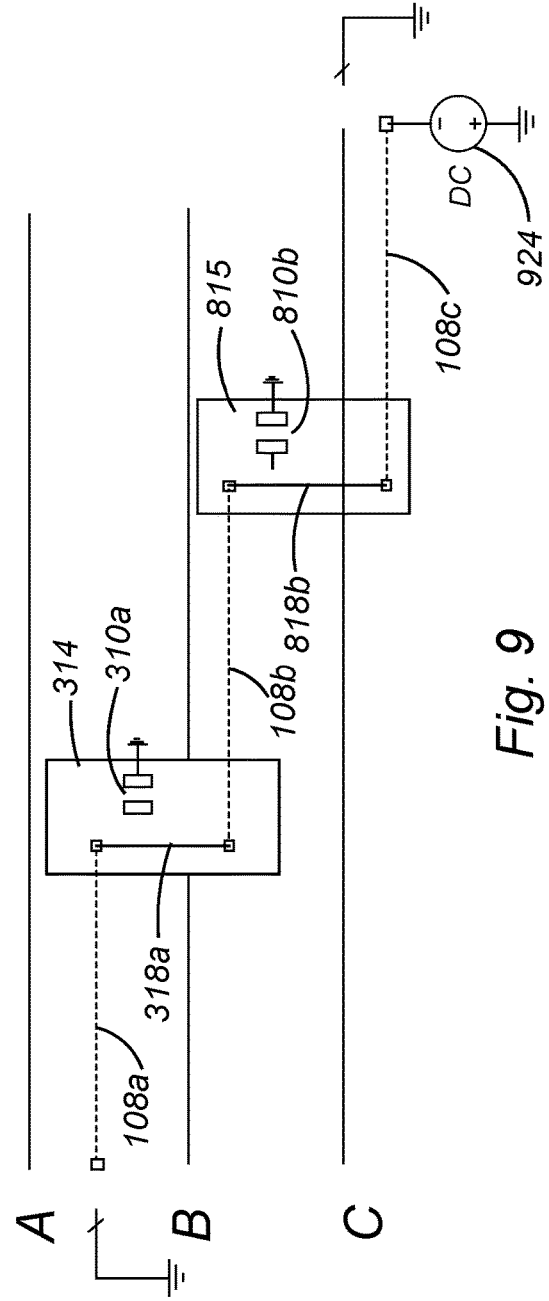

FUNCTIONAL RELIABILITY ASSESSMENT FOR INSULATED POWER CABLE SYSTEMS

(1) FIELD OF THE INVENTION

This invention relates to high voltage electric cables and to methods and apparatus for assessing the functional reliability of the metallic shield bonding and grounding configurations of those cables.

(2) BACKGROUND OF THE INVENTION

High voltage electric power cables for underground applications are comprised of a high voltage electrical conductor, covered in order with an electrical insulation, a metallic shield, and a protective jacket. A typical AC high voltage circuit includes three individual phase high voltage cables that are installed in separate conduits which are encased in a common duct bank, which forms an underground 3-phase ac cable circuit to interconnect utility substations, overhead lines and submarine cable transitions. The manufactured lengths of these cables are limited by packaging, transportation and installation constraints and as such the resultant cable circuit is comprised of segments, or sections, along a cable route generally separated by manholes wherein each of the individual phases (A, B and C) is spliced to another segment of the same phase. Each segment may extend for several meters, e.g. hundreds of meters, or kilometers.

In its simplest configuration, each phase of the cable circuit is comprised of a high voltage conductor surrounded by electrical insulation that, in turn, is surrounded by a conductive shield and a nonmetallic protective jacket. That is, the conductor segment of a phase (for example, phase A) is concentrically surrounded by a corresponding segment of the shield (also of phase A), and both the conductor and shield extend along a length of the high voltage cable circuit. The shield is intended to confine the electrical stress to the cable electrical insulation and provide a suitable return path for system fault current The cable shield can be connected to ground at more than one point along the circuit length (multipoint grounded arrangement) but this results in current flow in the cable shield between the grounded points. The amount of current flowing in the shield will depend on the arrangement of the phase conductors within the duct bank, the electrical conductivity of the cable shields and the load current flowing in the high voltage cable conductor. This "induced shield current" can be high enough to produce undesirable heat loss in the shields and limit the ampacity (current carrying capacity) of the cable circuit.

As an option the cable shield may be physically connected to electrical ground at only one point along the circuit length (single point ground configuration). In this configuration there is no circulating current to limit cable ampacity. But in this single point ground configuration the induced shield voltage increases with distance from the grounding point. This shield voltage also depends on the physical separation between cable phases and conductor load current. The induced shield voltage can be quite high even under normal loads, reaching damaging levels during faults and transient surge conditions. To minimize, or avoid, damage due to high shield voltages, as may arise from time to time due to load switching or a lightning strike, a surge arrestor, often referred to as a shield voltage limiter (SVL), is normally installed at the ungrounded more easily accessible end point of the shield. The SVL limits transient potential differences that occur between the shield and ground to acceptable levels. SVLs are composed of ceramic metal oxide blocks which can be characterized as a non-linear resistor that exhibits decreasing resistance values as the voltage across the SVL increases beyond its conduction threshold voltage. SVLs come in various voltage classes and energy capacity. They may be thought of as behaving like an open circuit during normal power operation and a short circuit during transient surges when the potential across the SVL exceeds its conduction threshold voltage. As is known, normal power operation of the high voltage cable refers to the typical 60 Hz or 50 Hz frequency (i.e. power frequency) of the current flowing in the cable.

In a single point ground configuration SVLs are installed between the end of an ungrounded shield segment and ground to clamp possible over-voltages to levels well below the dielectric strength of the cable jacket. The SVLs therefore protect the cable jackets from failure resulting from high voltage transient surges. Cable splices joining consecutive segments contain a shield interrupting gap, referred to as a "shield break", which effectively isolates the respective shield segments from one another, allowing them to operate at different potentials. As such, these gaps should survive transient surges.

SVLs are non-linear devices that have a characteristic voltage-current relationship which is well defined and understood. The resistance of the SVL depends on the voltage applied across the device. Once the conduction threshold voltage of the SVL is exceeded, any increase in voltage results in a disproportionately increasing current. The energy imparted during conduction is dissipated by the SVL as heat. Below its conduction threshold voltage, the current through the SVL is capacitive, out of phase with and proportional to the voltage across the SVL. This current is of such a low level (less than 1 milliamp) that during normal operation substantially no energy is dissipated, and no temperature rise is detectable at the surface of the SVL. But, as the voltage across the SVL progressively increases and crosses the conduction threshold voltage level, the SVL behaves resistively with current increasing exponentially and shifting toward being in phase with the voltage, generating heat that will cause the surface temperature of the SVL to increase. This surface temperature rise can be observed even when the SVL is subjected to very short duration transient surges at voltage levels below their rated energy capacity. This is normal and cooling occurs after the surge dissipates.

Additionally, the current through the SVL, is out of phase with the voltage across the SVL.

In a cross-bonding configuration, shield ground continuity is maintained from end to end while connecting (or cross-bonding) the shield segments of each phase conductor in order to minimize current flow in the cable shielding system. Cross-bonding is provided in two manholes, preferably located at the ⅓ point and ⅔ point between the grounded points along the circuit length. In this cross-bonded configuration, the net vector sum of the voltage induced into the shield from each of the three phases is zero, no current flows in the cable shields and little measurable voltage occurs between the cross-connected points of the shields and ground.

However, under fault conditions or transient voltage events the cable shield circuit is not phase balanced and the resulting voltages and currents will not follow expectations based on normal power frequency operations. These events are very short in duration and would not be of consequence from a ratings perspective but can result in damaging high shield voltages.

To facilitate the cross bonded shield configuration the continuity of the cable shield around each phase conductor is interrupted (the shield interrupting gap) at the cross bonding points to allow the shield of one phase to be connected to the shield of a different phase. This shield break allows the shield segments to operate at different potentials and should have adequate dielectric strength to survive the overvoltage transients. SVLs are utilized to clamp the shield voltages to safe withstand levels for both the cable jacket and the shield break. Although cable shield voltages are typically below 100 volts during normal operation, the dielectric strength of the components protected by the SVL for transient surges is designed to be greater than 20 kV. SVLs, when installed, clamp voltages to levels well below the withstand strength for the cable shielding system components.

The cable shield arrangements consisting of single point grounding and cross-bonding configurations can be applied together on the same circuit to achieve the greatest ampacity for the circuit. As an example, three cable sections or segments configured in a cross-bonded shield arrangement may also include a subsequent segment configured as a single point grounded shield segment which would result in minimal or virtually no shield current in these four segments.

Link boxes are sealed enclosures that encapsulate the hardware associated with the cross-bonding and grounding of the cable shields and the SVLs used to protect the cable jackets and shield breaks from failure. They often contain removable conductor links to facilitate shield reconfigurations and out-of-service maintenance testing of the cable jackets and shield break gaps. Dielectric failure of the jacket, the shield breaks or the SVLs can result in cable shield currents and associated heat losses in the shields that are not accounted for in the operational ratings of the cable, resulting in higher than expected cable operating temperatures. Damage to the SVL can occur from sustained overvoltage (extended operation in the SVL conduction transition region) and from exposure to transients higher than levels the SVL can safely handle. These conditions lead to internal heating of the SVL, degradation and possible failure of the SVL.

Link boxes are generally found in manholes where the cable and shield segments are joined by the splice hardware. Access into the manhole requires de-energizing the high voltage cable circuit, removing any water present in the manhole, testing for gases, adhering to important safety precautions and servicing the cable circuit and shield, all in a very confined space. As such, operational verifications, consisting of periodic "out of service' inspections, which may include specific maintenance tests, are time consuming and expensive and rarely practiced. In many instances, component failures in the link box are discovered during post fault investigations. Finding a link box full of water during periodic inspection and post fault inspection, which effectively shorted out all internal components, is not unusual Sensors to perform in-situ measurements of the current flowing through the interconnected shield segments, the current that flows from a link box to ground, the voltage that appears between the link conductor (or cable shield) and ground, the surface temperature of the installed SVL, or the environmental conditions (pressure, temperature and humidity) that exist within the sealed link box enclosure are well known and commercially available. However, there is a need for selecting and packaging these sensors within the confines of the link box enclosure, transmitting the sensor information from such locations, typically below grade, to a location at which such information is processed and used to perform an operational validation, or condition assessment, and diagnosis for potential abnormalities of the cable shield system, and particularly the SVLs in that system.

Condition assessment of the installed SVLs has previously been limited to visual inspection during maintenance outages. This requires entry into the manhole in which the link box is located, physically opening the link box to observe the condition of the links and SVLs, and then estimating the operating "health" (i.e. operational integrity) of the SVLs based on their visual appearance. Recognizing the weakness of this procedure, some utilities simply replace SVLs and recycle those that subsequent lab testing demonstrates to be operationally suitable. Field inspection, as currently performed, is of marginal value, is labor intensive and fraught with safety implications. As a result inspections are performed at widely spaced time intervals at best; thus limiting their value especially in evaluating the condition of the installed SVLs.

Remote monitoring of the shield system parameters to identify faulty operation coupled with a field test to verify the operational integrity of link box-installed SVLs that does not require manhole entry would provide utilities with a safe, low cost means and method that could directly or indirectly characterize the electrical behavior of the cable shielding system and in particular the installed SVLs, thereby providing a significant improvement over current conventional practice.

SUMMARY OF THE INVENTION

As an advantage, the present invention provides a means and method to conduct "out of service" maintenance tests to ascertain the functional reliability of the high voltage cable shield system and its associated components, including SVLs and make required repairs or replacement and then confirm the system operation is as designed. Condition assessment and diagnosis of abnormalities in the cable shield system is derived from a combination of sensor inputs (e.g. voltage, current, temperature) from sensors preferably deployed within the enclosure (e.g. the link box) in which segments of the cable shield are connected.

The functional reliability, or operational functionality, of a SVL can be determined from its characteristic voltage-current relationship. This voltage-current relationship is measured by applying a ramp or stepwise test voltage to the SVL while monitoring the current flowing through it. At the conduction threshold voltage of the SVL the current increases exponentially causing the metal oxide blocks to increase in temperature. As such, the voltage-current characteristic of the SVL can be measured directly or inferred through its voltage-temperature characteristic. Temperature sensors, which may be provided to measure the SVL surface temperature during normal operation, thereby detecting abnormalities, can be utilized to monitor the surface temperature of the SVL, thereby monitoring the response of the SVL to a test protocol (i.e. a test voltage) that drives the SVL into its conduction region. The surface temperature rise may be directly correlated to the SVL current flow and as such is an effective means to assess the functional reliability, or operational integrity, of the SVL.

Information from sensors within the confines of the link box enclosure, which may be in remote locations, including below grade locations, are transmitted, and used to monitor the link box condition during normal operation. Voltage, current and temperature information collected during out-of-service maintenance testing can identify SVL anomalies prior to failure.

Advanced warning of anomalous conditions provides the opportunity for scheduled corrective measures. However, heretofore, no simple warning means are presently available. The present invention makes it possible, using sensors, to measure and monitor the operating and environmental conditions within the link box during maintenance testing to verify the operating characteristics of the installed SVLs.

Applying an increasing test voltage level to the cable shield and measuring the current through the SVL directly or indirectly yields a characteristic Voltage-Current or Voltage-Temperature curve for comparison with a new, or reference, unit. Such SVL characteristics may be measured with the same sensors used to monitor the shielding system during normal operation. The present invention employs an in-situ test protocol sensitive enough to track an installed SVL through its characteristic conduction transition region.

An object of the invention is to provide a system and method to sense, test, evaluate, diagnose and/or report, during a system test, the condition of the shielding system, including enclosures, without requiring opening the sealed covers of those enclosures. This is achieved by transmitting a collection of sensor inputs on the electrical and environmental condition of the cable shield system, including its associated components, to system operators in near real time using a variety of communications options (including LP-WAN), without accessing the manholes and opening the sealed covers which could compromise the environmental seals of those enclosures.

Another object of this invention is to provide a maintenance test to stimulate a measurable response indicative of the expected behavior of a functional bonding and grounding arrangement of the cable shield system, and particularly the installed SVLs.

The maintenance test monitors the voltage across and current flowing through the SVL in response to an external test voltage supplied to the cable shield segment. In one embodiment, the SVL current is represented by the heat dissipated by the SVL and sensed by a heat sensor.

In accordance with one aspect of the invention, the condition of the high voltage cable shield system of a high voltage cable circuit is determined during maintenance testing by electrically disconnecting all operational grounding points of the cable shield segment that are subjected to the maintenance test, thereby isolating that segment from ground. A test voltage of gradually increasing amplitude is supplied to an end of the isolated shield segment, distant from the covered enclosure that houses a connector link to which the ungrounded shield is connected to ground potential via a shield voltage limiter (SVL). The voltage across the SVL and resulting surface temperature of the SVL in response to the applied test voltage is monitored and recorded, preferably within the link box. The condition of the SVL is determined by comparing the voltage-temperature characteristic of the installed SVL to the voltage-temperature characteristic of the same or similar reference SVL or to adjacent SVLs that are not subjected to the same test voltage.

In accordance with a further feature of this invention, the enclosure or link box that cross-bonds successive shield segments provides electrical connection to a plurality of installed SVLs on the cable circuit.

In one embodiment, at least one other link box houses a connector link for connecting the shield of the different phase to the shield of yet another phase. Accordingly, the shield of a first phase is electrically connected through the connector link in the first link box to the shield of a second phase, and the shield of the second phase is connected through the connector link in the other link box to the shield of a third phase. In this configuration, SVLs in a plurality of the link boxes may be simultaneously subjected to a test voltage while sensors in the link boxes monitor the local response of the respective SVLs to that test voltage.

As another feature of this invention, the condition of the cable shield system is determined at a remote location to which information representing the voltage, current and temperature of the SVL during routine "in-service" operation and during a "out of service" maintenance test are transmitted to the remote location for processing and evaluation of the condition of the cable shield system. For example, the voltage, current and temperature information is transmitted to the remote location via a low-power wide-area network (LP-WAN) or other wireless system; or by fiber optic cable. This information can be combined with similar data from other sensors deployed on the cable circuit and analyzed to establish the operational integrity of the shield bonding and grounding system for the cable circuit.

Various other objects and advantages of the present invention will become apparent from the ensuing detailed description; and the novel features will be particularly pointed out in the appended claims.

BRIEF DESCRIPTION OF THE DRAWINGS

The present invention will best be understood by the ensuing detailed description taken in conjunction with the accompanying drawings in which:

FIG. 8 illustrates the grounding and bonding configuration of a cross-bonded shielding arrangement with three shield segments between the grounding points;

FIG. 9 schematically illustrates a maintenance test configuration on a cross-bonded shielding arrangement with three shield segments between the grounding points;

DETAILED DESCRIPTION

Figure 1:
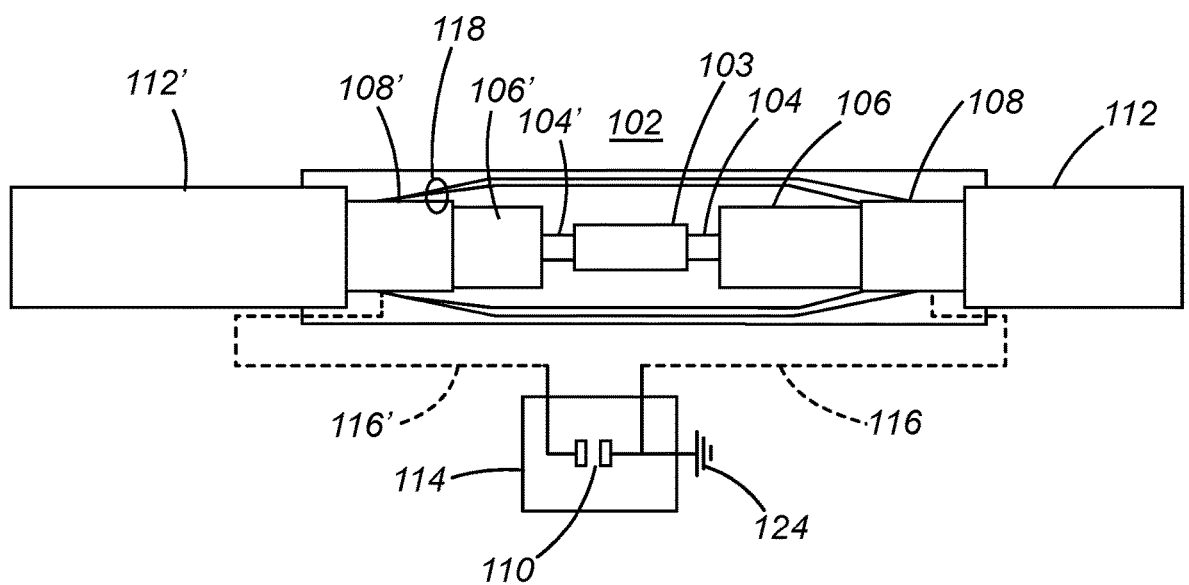
FIG. 1 illustrates a typical connection, or splice, of a high voltage cable circuit with shield continuity break and SVL.

Turning now to the drawings, wherein like reference numerals are used throughout, FIG. 1 illustrates a high voltage cable circuit 102 including two segments, or sections, formed of high voltage conductors 104 and 104' electrically connected by a conductor splice 103 included in the illustrated splice hardware. As is appreciated, for high voltage ac transmission, conductors 104 and 104' are of the same phase, for example, phase A, in a typical 3-phase transmission system. A conductor insulator 106 surrounds conductor 104 of the illustrated segment of cable circuit 102; and insulator 106 is, in turn, concentrically surrounded by cable shield 108. Likewise, insulator 106' surrounds conductor 104' of the spliced segment and insulator 106' is concentrically surrounded by cable shield 108'. A cable jacket 112, 112' surrounds each respective segment of the cable circuit.

A shield break (or shield interrupting gap) 118 electrically insulates shield segment 108 from shield segment 108' to interrupt electrical continuity from shield segment 108 to shield segment 108' and prevent current flow between the cable shield segments. The shield break eliminates the circulating shield current that would otherwise flow in the shield segment, which would reduce the cable ampacity. The shield break is filled with a dielectric insulating material and allows shield segments 108 and 108' to operate at different voltage potentials. These potential differences, as well as the potential difference which exists between the respective shield segment and ground, are generally low during normal operation of the cable circuit but can be large enough to cause dielectric failure of the shield break insulation or cable jackets in the event of power system faults or transient over-voltages caused by switching and lightning surges. Dielectric failure (e.g. shorting to ground) of the shield break or cable jackets can lead to unintended current in the cable shield segments that is unaccounted when rating the cable, resulting in higher cable operating temperatures and possible cable failure that may be initiated by arcing and the formation of surface carbon caused by arcing, known as tracking between shield segments at the shield break. As is known, link boxes contain the hardware necessary to configure the grounding and bonding of the cable shielding segments, including the SVLs that are installed to prevent dielectric failure by limiting the over-voltages to levels that can be sustained without damage to the shield breaks and cable jackets.

FIG. 1 shows a bonding lead 116 of one segment, shown as shield segment 108, physically connected to electrical ground 124 and the bonding lead 116' of the other, spliced segment, i.e. shield segment 108', connected through a shield voltage limiter (SVL) 110 to electrical ground 124. For simplification, the drawing figure illustrates just one of three phases of the high voltage cable circuit. This cable shield connection is typical for each phase in a single point shield grounding configuration. SVL 110 is housed within an enclosure, preferably a link box 114, described below. In other link box configurations, bonding leads 116, 116' of the cable shields 108, 108' of the spliced segments may be interconnected through a connector link, as will be described below.

The cable shield system depicted in FIG. 1 is representative of a single point cable shield grounding configuration whereby cable shield 108 is grounded at the link box 114 location and is ungrounded (isolated from direct connection to ground) at its remote end, i.e. remote from the link box. Similarly cable shield 108' is ungrounded (not directly connected to ground) at the link box 114 and is connected to ground at a point (not shown) remote from link box 114. In the link box 114, SVL 110 is connected by bonding lead 116' to the ungrounded point of shield 108' to provide a low resistance current path to ground for discharge current in the event the voltage between the shield 108' and ground 124 exceeds a critical value, thus limiting transient voltages between the shield and ground and thereby assuring that such transients do not exceed the dielectric strength of cable jacket 112' or shield break 118.

Figure 2:
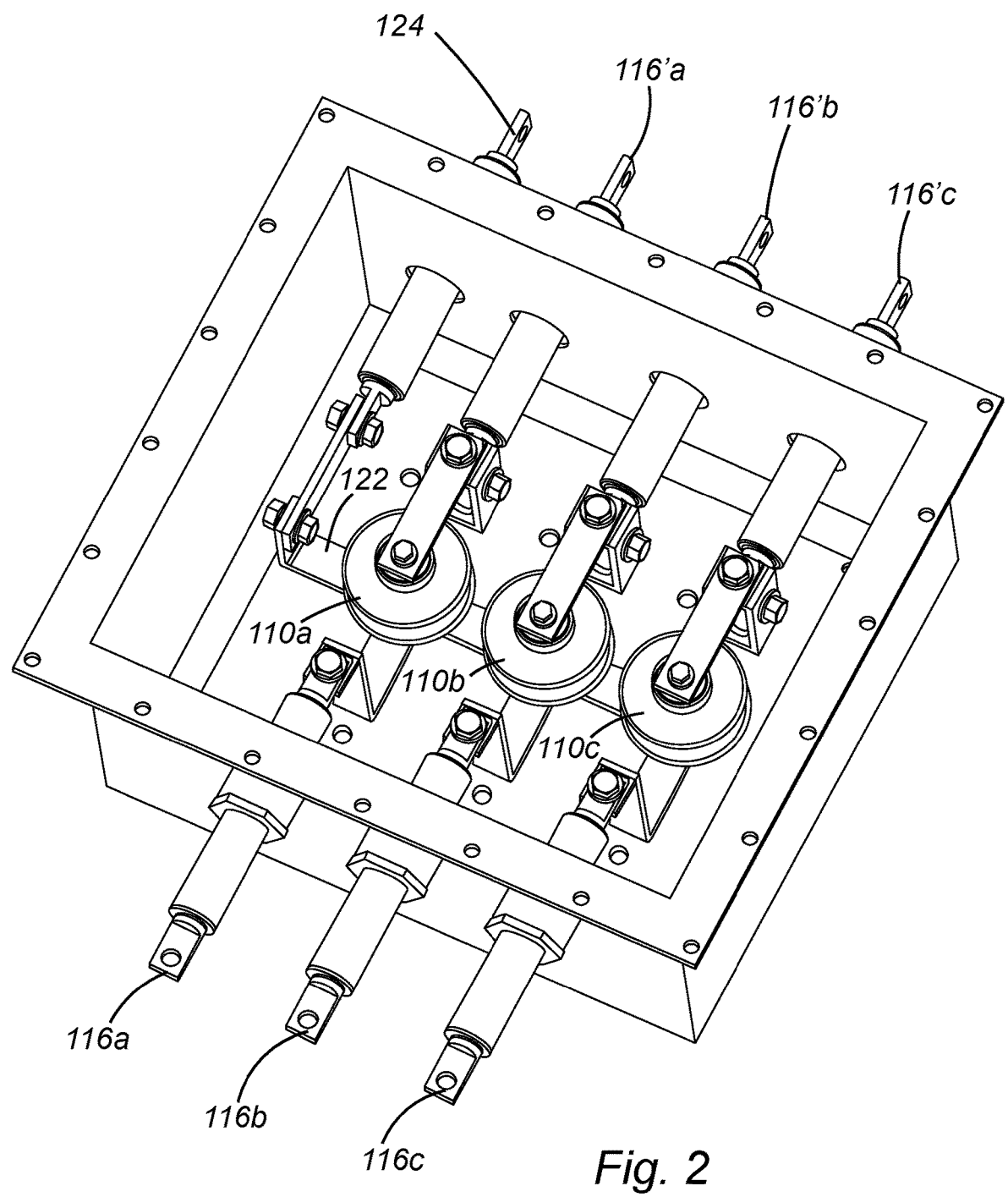
FIG. 2 illustrates the construction of a three phase link box with SVLs for a single point shield grounding configuration in which the present invention finds ready application.

FIG. 2 is an illustration of a three-phase link box configured to support the shield bonding and grounding configuration illustrated in FIG. 1. As shown, SVLs 110a, 110b and 110c are electrically and physically connected by the bonding leads 116'a, 116'b and 116'c to cable shields 108'a, 108'b and 108'c, respectively (not shown). FIG. 2 also illustrates the common SVL ground conductor 122 connection to external ground via grounding lead 124. As shown, FIG. 2 illustrates the grounding of bonding leads 116a, 116b and 116c to ground 124 via internal connection 122

Figure 3:
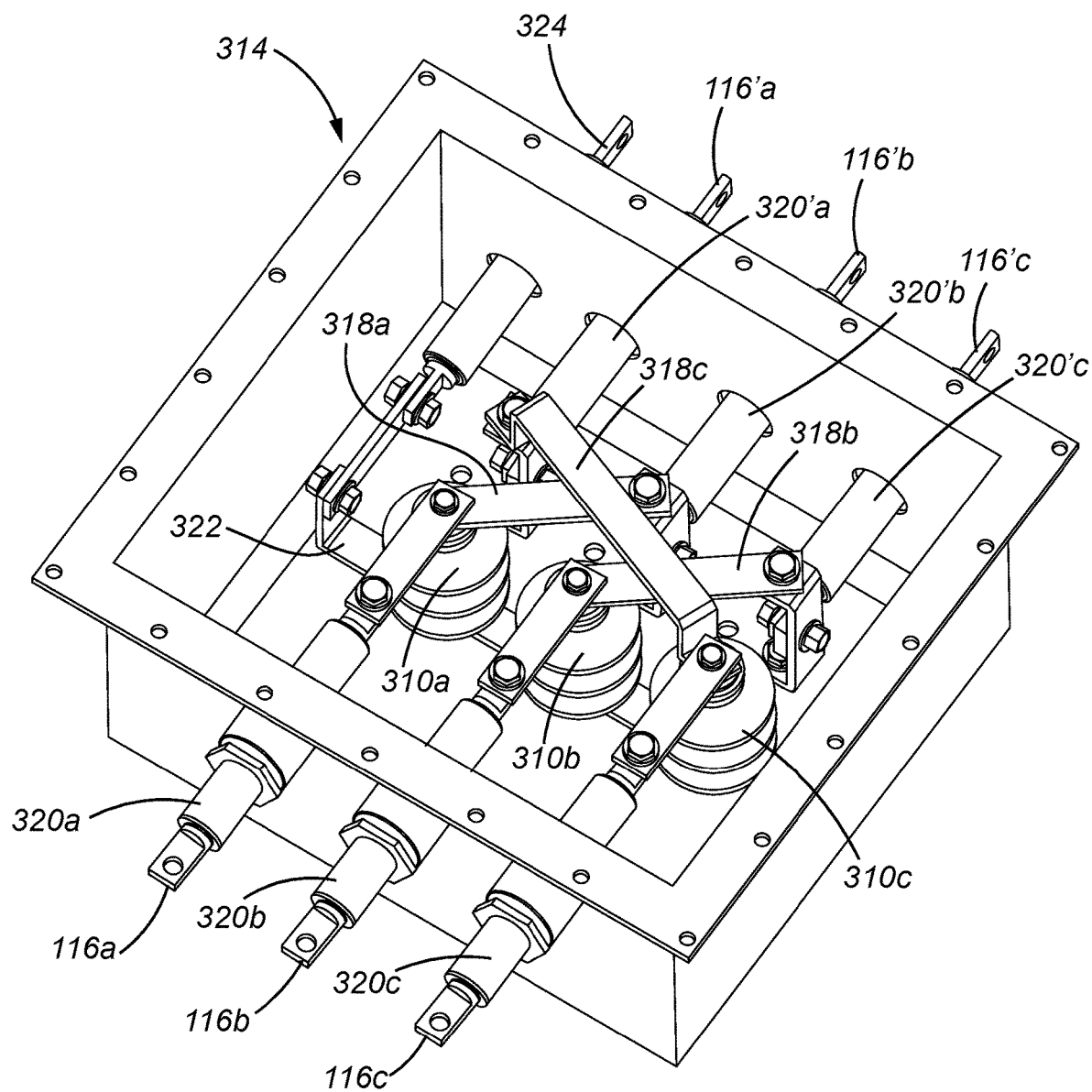
FIG. 3 illustrates a three phase link box with SVL for a cross-bonded shield configuration in which the present invention finds ready application.

Turning to FIG. 3, an example of a cross bonding link box 314 is illustrated. The link box is formed as an enclosure with external bonding lead connectors 320a, 320b, 320c projecting outwardly from the interior of the enclosure (as seen on the bottom of FIG. 3), through suitable seals, to which insulated bonding leads 116a, 116b, and 116c from the shields of phases A, B and C, (108a, 108b and 108c not shown) respectively, are mechanically and electrically connected. The bonding lead connectors are, in turn, connected to connector links 318a, 318b and 318c, respectively. Alternatively bonding lead connectors 320a, 320b, 320c may be located within the housing and the insulated bonding leads 116a, 116b, 116c may be routed through sealable penetrations in the link box and connected to connector links 318a, 318b and 318c, respectively. Bonding lead connectors (not shown) project outwardly from the interior of the enclosure through suitable seals to which bonding leads 116'a, 116'b and 116'c (as seen on the upper side of FIG. 3) from the shields of phases A', B' and C' (108'a, 108'b and 108'c not shown), respectively, are mechanically and electrically connected. Connector links 318a, 318b and 318c serve as cross bonding links to connect bonding lead 116a to bonding lead 116'b, bonding lead 116b to bonding lead 116'c and bonding lead 116c to bonding lead 116'a, respectively. Thus, the shield of phase A is electrically connected (i.e. cross linked) to the shield of phase B'; the shield of phase B is electrically connected to the shield of phase C'; and the shield of phase C is electrically connected to the shield of phase A'. Hence, the shields of the cable conductor segments of phases A, B and C are cross bonded to the shields of the cable conductor segments of phases B', C' and A', respectively. The shields of phases B', C' and A' are similarly cross bonded in the next link box along the circuit length to phases C", A" and B", respectively (not shown) forming three segments of similar length. The remote ends (not shown) of the cable shields of the three cable shield segments are grounded. In this arrangement the net induced shield current between the grounded remote ends and the shields will be minimized.

FIG. 3 also illustrates the connection of the shield voltage limiters (SVLs), referred to collectively as SVLs 310. SVL 310a is connected to bonding lead 116a and 116'b via link 318a, thus, to cable shield segments 108a and 108'b. When the SVL conducts, the SVL provides a low resistance current path for these cable shield segments to ground 324 via ground connection 322 common to all the SVLs. Likewise, SVL 310b is connected to cable shield 108b and 108'c, to provide a low resistance current path from these cable shield segments to ground. And SVL 310c is connected to cable shield 108c and 108'a to provide a low resistance current path from these cable shield segments to ground. As mentioned above, the SVLs are installed to limit transient over-voltages, when they occur on the respective shields segments, primarily as a result of switching and lightning surges.

In an alternative embodiment, bonding lead 116'b may be connected to bonding lead connector 320'a such that, as in the illustrated arrangement, connector link 318a still connects the shield of phase A to the shield of phase B'. Similarly, bonding lead 116'c may be connected to bonding lead connector 320'b such that connector link 318b still connects the shield of phase B to the shield of phase C'; and bonding lead 116'a may be connected to bonding lead connector 310'c such that connector link 318c still connects the shield of phase C to the shield of phase A'.

Proper operation of a high voltage cable shield circuit for single point grounding configuration of the cable shields and for cross-bonded shield configuration, to prevent or minimize current flow in the cable shields, depends, at least in part, on proper functioning of the SVLs, to prevent over voltages from damaging the cable jackets and the shield breaks. Heretofore, the determination of the functional reliability of the link box components was based on periodic out-of-service visual and tactile inspection of the hardware and on a dielectric withstand test of the shield bonding components. This inspection process requires a circuit outage, traffic control measures and confined space entry procedures simply to gain physical entry into the manholes where the link boxes are typically located—all this before the link boxes can be physically opened for inspection and subsequent restoration. Consequently, these current methods of inspection are labor-intensive and are performed infrequently at best. As a result, degraded, damaged or failed components go unnoticed until discovered during subsequent investigations occasioned by system failure. The present invention, as discussed below, obviates these problems, resulting in improved evaluation and determination of the functional reliability of the cable shielding system and thus the overall reliability of the high voltage cable circuit.

Figure 4A:
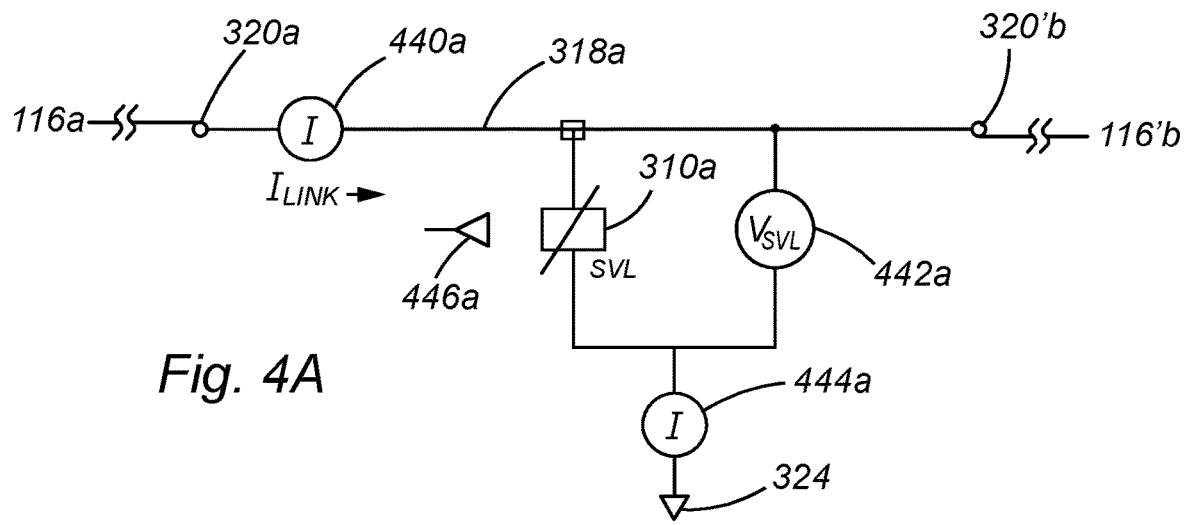
FIG. 4A is an AC equivalent circuit schematic diagram of parameter sensors installed on a respective shield segment phase in a three-phase cross-bonding link box to provide in-service operational and out of service maintenance test data of the cable shielding system.

FIG. 4A is a schematic representation of parameter sensors installed on each of the three bonding links present in the cross-bonding link box shown in FIG. 3. For simplicity the sensors installed on connector link 318a and SVL 310a are illustrated. It will be recognized that identical sensors are installed on connector link 318b and SVL 310b and on connector link 318c and SVL 310c.

During normal continuous circuit power frequency operation of the high voltage cable (typically operating at 50-60 Hz) any current flowing through conductor link 318a, connecting bonding leads 116a to 116'b is detected by a current sensor 440a and the voltage that appears across the SVL 310a, electrically connected between the conductor link 318a and ground 324, is detected by a voltage sensor 442a. The current sensor 440a may be a conventional current transformer, Rogowski Coil or any suitable means to quantify the magnitude of the current flowing through the conductor link. The voltage sensor 442a may be a resistive or capacitive voltage divider or other voltage sensing means to quantify the magnitude of the voltage across the SVL 310a. Preferably, the SVL voltage sensed by sensor 442a during normal circuit operation remains below the conduction threshold voltage of SVL 310a. In this state of operation, the apparent resistance of SVL 310a is high and the current though the SVL and its associated conduction losses are negligible. The SVL surface temperature will remain at ambient temperature. The current to ground detected by a current sensor 444a connected from the junction of the SVL and the voltage sensor to ground will be only that which flows through the voltage sensor 442a which is negligible at normal operating voltages. It is possible during power system faults having a duration on the order of milliseconds, for the voltage across the SVL 310a as measured by voltage sensor 442a to reach the SVL conduction threshold voltage, causing increased current flow through and heating of the SVL 310a. This situation is more likely to occur in the single point grounded shield arrangement illustrated in FIG. 2 where the SVL is positioned at the ungrounded end of a long cable shield segment grounded at its opposite end. In the event of such an occurrence, the resulting shield voltage is detected by voltage sensor 442a and the current flowing to ground as a result of conduction of the SVL is detected by current sensor 444a. The energy imparted to the SVL during this event causes the surface temperature of the SVL to increase, which is detected by a non-contact infrared temperature sensor 446a or, possibly, a thermocouple. The voltage, current and temperature rise may be compared to the known voltage-current and voltage-temperature characteristics of the installed SVL, thereby indicating operability of the SVL, as will be discussed.

For transient electrical surges (measured in microseconds) caused by switching operations or lightning strikes, which exceed the conduction threshold voltage of the SVL, a transient increase in current is to be expected and the resulting heat will cause the surface temperature of the SVL to rise and subsequently cool. Voltage sensor 442a and current sensor 444a may capture and measure this voltage and current and temperature sensor 446a will capture the surface temperature rise and subsequent decay.

It will be appreciated by those of ordinary skill in the design, installation and maintenance of cable shield bonding and grounding systems that the in-service data acquired from link current sensor 440a, ground current sensor 444a, voltage sensor 442a and temperature sensor 446a from each phase of each link box assigned to a specific circuit can provide continuous near real time verification of in-service cable shielding system operation and can detect abnormalities that may warrant further investigation and potential remediation.

In the foregoing discussion, the sensors merely confirm or validate that the link box and installed SVL have or have not responded correctly during operational events. Although this clearly adds value compared with present practice, condition assessment here relies upon past operational events, i.e. sensor information after the fact, to detect abnormalities. However, these same sensors used to detect abnormalities due to the past occurrence of events, such as transient surges, can be used to assess the functional reliability of the installed SVLs by verifying the correct sensor response to an external test voltage applied to the cable shield circuit during maintenance testing, as will be described.

Figure 4B:
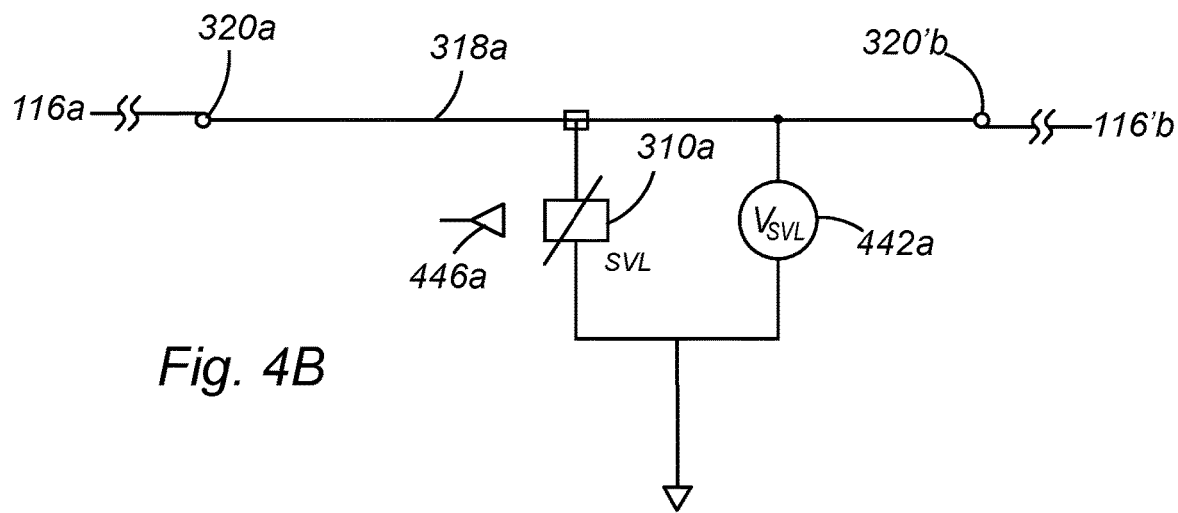
FIG. 4B is a DC equivalent circuit schematic diagram of parameter sensors installed on a respective shield segment phase of in a three-phase cross-bonding link box to provide out of service maintenance data of the cable shielding system.

FIG. 4B is the DC equivalent schematic diagram for DC voltages that would appear on the cable shield segments when subjected to out-of-service field maintenance testing using externally applied DC voltages. Under DC conditions current transformers 440a and 444a, though present, are not functional and thus, to simplify the drawings, are not shown in the equivalent circuit of FIG. 4B. In this case, the DC voltage on the cable shield and across the SVL, as a result of the externally applied DC voltage, is detected by voltage sensor 442a. At voltages below the SVL conduction threshold voltage negligible current flows through the SVL and no detectable SVL surface temperature rise will be detected by temperature sensor 446a. At voltages exceeding the conduction threshold voltage, the SVL current increases and the heat dissipated by SVL 310a increases resulting in a surface temperature increase detected by sensor 446a.

Figure 4C:
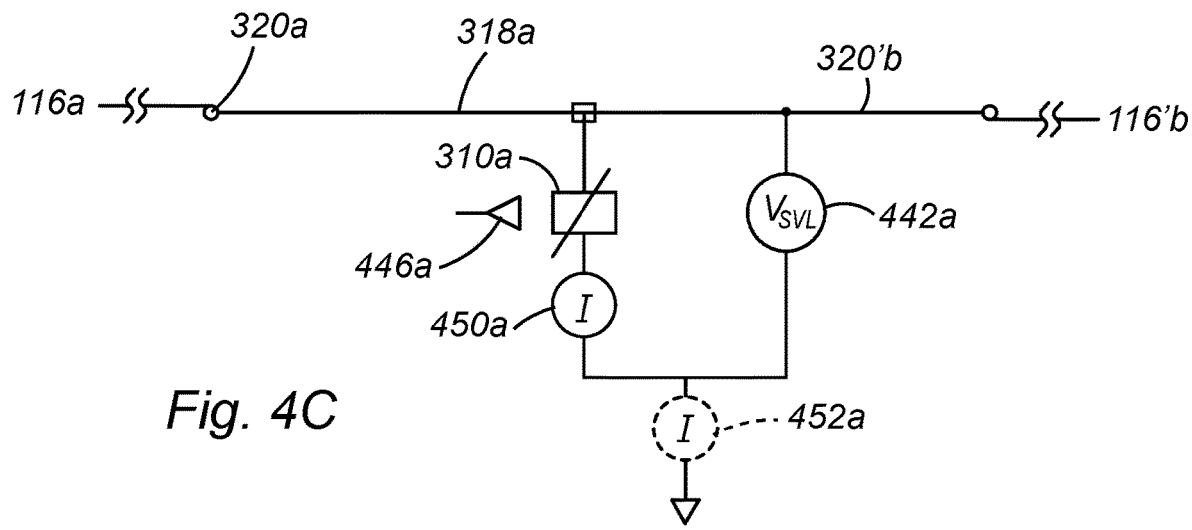
FIG. 4C is an equivalent DC circuit schematic diagram of parameter sensors installed on a respective shield segment phase in a three phase cross bonding link box to provide out of service maintenance test data of the cable shielding system using a Hall effect current sensor.

FIG. 4C is a schematic diagram of an embodiment to directly measure DC current flow through the SVL. The figure shows a Hall effect device 450a in series with SVL 310a. Alternatively, the Hall effect device can be positioned, as at 452a, between ground and the junction of the SVL and voltage sensor 442a, as in the same location as current sensor 444a in FIG. 4A, that is, in outgoing ground connection 452a, with only a marginal loss in accuracy given the low current associated with the voltage sense circuitry. Hall effect devices are well known and measure the intensity of a magnetic field to produce a proportional voltage output. As such, Hall effect devices, can be used for DC and AC current measurements as low as a few milliamps. In one embodiment, a Ferromagnetic core is used to concentrate this magnetic field, making it possible to detect very low level of current. While these devices are normally used for measuring current levels on the order of a few amps and greater, instruments are commercially available that will measure into the single digit milliamps and can be used to calibrate and trouble shoot transducers having 4-20 milliamp outputs. Hall effect devices are an alternative option for the current transformers discussed above in connection with FIG. 4A to measure current flow from the link box to external ground connection. The use of Hall effect devices are particularly advantageous during maintenance testing using a DC voltage source to apply the test voltage. The current information produced by the Hall effect device directly measures current through the SVL, obviating the need for a surface temperature sensor. As the test voltage on line segment 116a detected by voltage sensor 442a increases, the current through the SVL, as detected by the Hall effect device 450a or alternatively by Hall effect device 452a, likewise increases, consistent with the characteristics of the installed SVL. This current information is acquired, along with the voltage information representing the magnitude of the test voltage across the SVL, thereby establishing the voltage-current characteristics of the installed SVL, which can be compared to the voltage-current characteristics of a new or reference SVL. As a result of this comparison, the functional reliability of the SVL can be determined.

Figure 5:
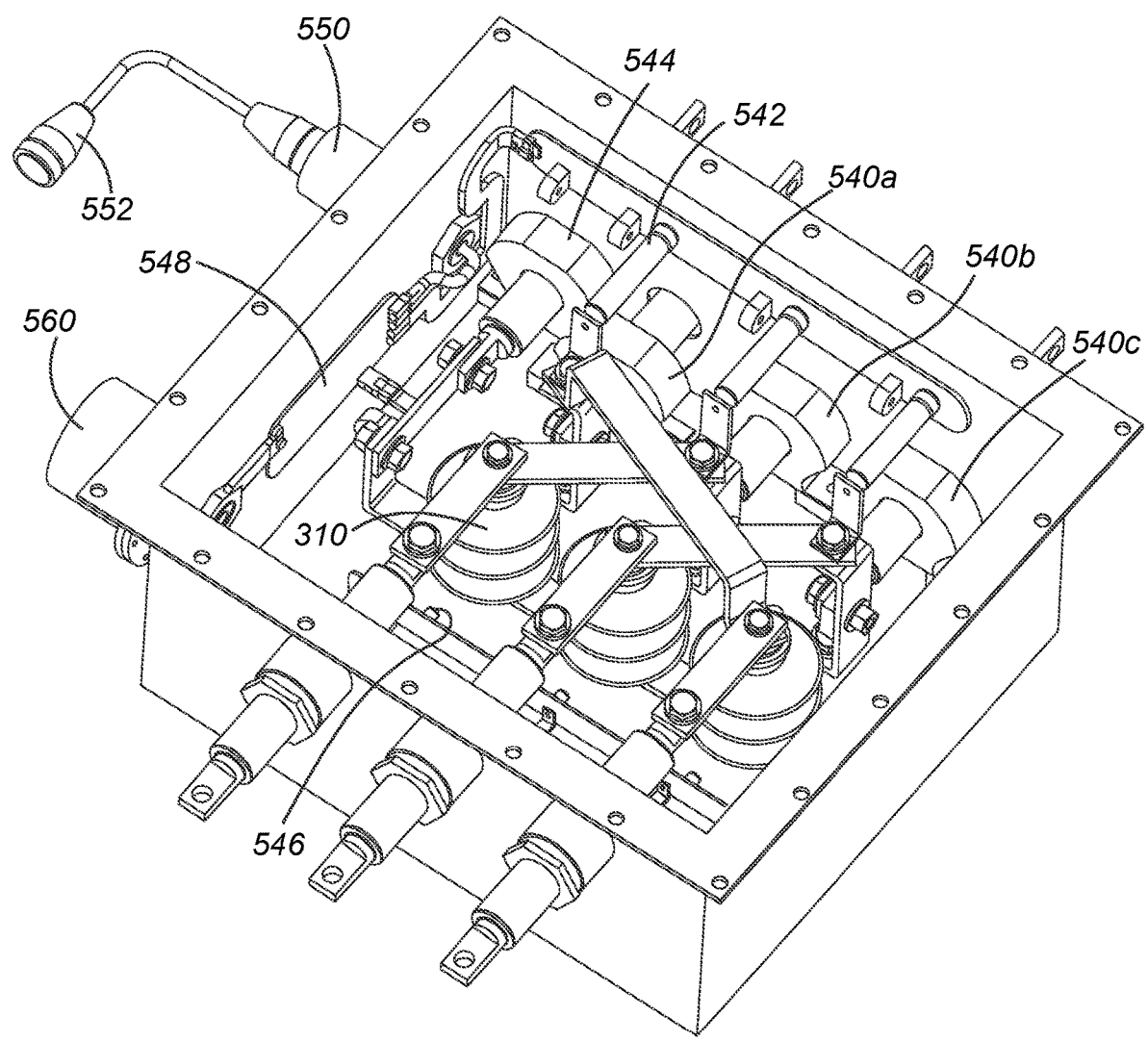
FIG. 5 illustrates a three phase cross-bonding link box incorporating the parameter sensors schematically illustrated in FIGS. 4A and 4B.

FIG. 5 illustrates an embodiment of the link box of FIG. 3, which includes the sensors schematically shown in FIG. 4A, such as a current sensor 540, similar to current sensor 440 in FIG. 4A, to measure link current, a current sensor 544, similar to current sensor 444 in FIG. 4A, to measure current to ground, a voltage sensor 542, similar to voltage sensor 442 in FIG. 4A, to measure voltage across the SVL, and a temperature sensor 546, similar to sensor 446 in FIG. 4A, to measure the surface temperature of the SVL. Atmospheric conditions such as temperature, pressure and humidity within the link box housing are measured by one or more environmental sensors (not shown) mounted on a printed circuit board 548. As one example, a microprocessor, or other processing circuitry, is mounted on the printed circuit board to control the acquisition and storage of sensor data. In this example power to operate the sensors is provided by a battery contained in a sealed separable housing 560. The embodiment of FIG. 5 also includes a fiber optic communications and control interface 550 coupled to a connector 552 for exchanging operating instructions and data with remote processing circuitry, such as a peripheral controller. The data acquired by the sensors can be analyzed by the processing circuitry individually or in combination with data from the other sensors within the same link box. This data can be processed with similar data acquired from sensors in other link boxes associated with the same cable circuit to provide utility asset managers with in-service performance indicators (voltage, current and temperature) under continuous normal operation and also under occasional fault conditions, such as during switching and lightning transient events.

In FIG. 5 the current flowing though the conductor link is measured with a cascade arrangement of current transformers 540a, 540b and 540c, whose secondary leads form the primary leads for transformers not shown. This cascade arrangement of current transformers reduces the effective link current, that can be as high as 250 amps or greater, to manageable signal levels on the order of milliamps, to be sent for processing by, for example, a microprocessor, to analyze possible fault conditions. The cascade arrangement of current transformers also improve the transient voltage withstand capabilities of the current measuring circuitry.

In the embodiment illustrated in FIG. 5 each of the voltage sensors is formed of a high voltage resistor connected in series with a low voltage resistor to form a high voltage divider circuit to reduce the actual voltage across the SVL to levels consistent with input levels normally provided to microprocessors which receive and process the measured voltages.

In the embodiment shown, temperature sensors 546 are non-contact infrared (IR) sensors arranged proximate respective SVLs 310 to produce output signals representing the surface temperature of the SVLs. The output signals produced by the temperature sensors are coupled to a controller, such as a processor on printed circuit board (PCB) 548 disposed within the link box. Alternatively, the output signals may be coupled to a processor disposed outside the link box and located in the manhole in which the link box is located. The temperature sensors detect the SVL surface temperature increases that result from operation above the SVL conduction threshold voltage that cause a rise in surface temperature.

Figure 6:
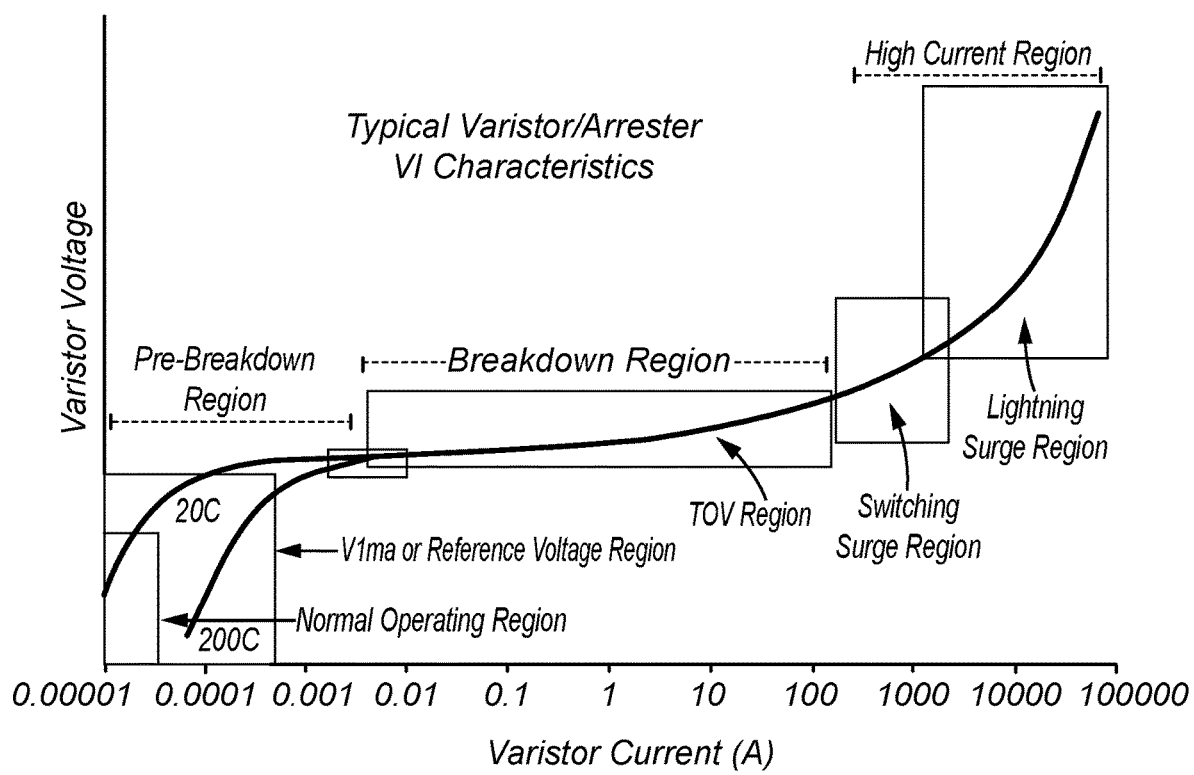
FIG. 6 is a graphical representation describing the voltage-current characteristics of an SVL over several magnitudes of operational current through the SVL.

A typical voltage-current relationship for an SVL is shown in FIG. 6. As can be seen from this figure, as the SVL voltage increases in its normal operating range (below the conduction threshold voltage) current through the SVL increases proportionally. At the conduction threshold voltage the SVL resistance drops and decreases exponentially with increasing voltage resulting in higher current, higher electrical energy loss and associated increases in temperature of the metal oxide block forming the SVL. Operating voltages beyond this point are limited by the SVL ratings to increasingly shorter durations to ensure the heat generated by the SVL can be safely dissipated and avoid failure of the SVL. As shown in FIG. 6, the normal continuous operating current through the SVL is below 1 milliamp while switching and lightning surges of microsecond durations can be clamped to prevent damage to the shield break and cable jackets at lightning discharge levels of 10 kA and higher. This voltage-current relation is representative of virtually all SVLs, varying only by the voltage in which the SVL enters its conduction transition region, which is approximately 1 milliamp for most SVLs.

Figure 7A:
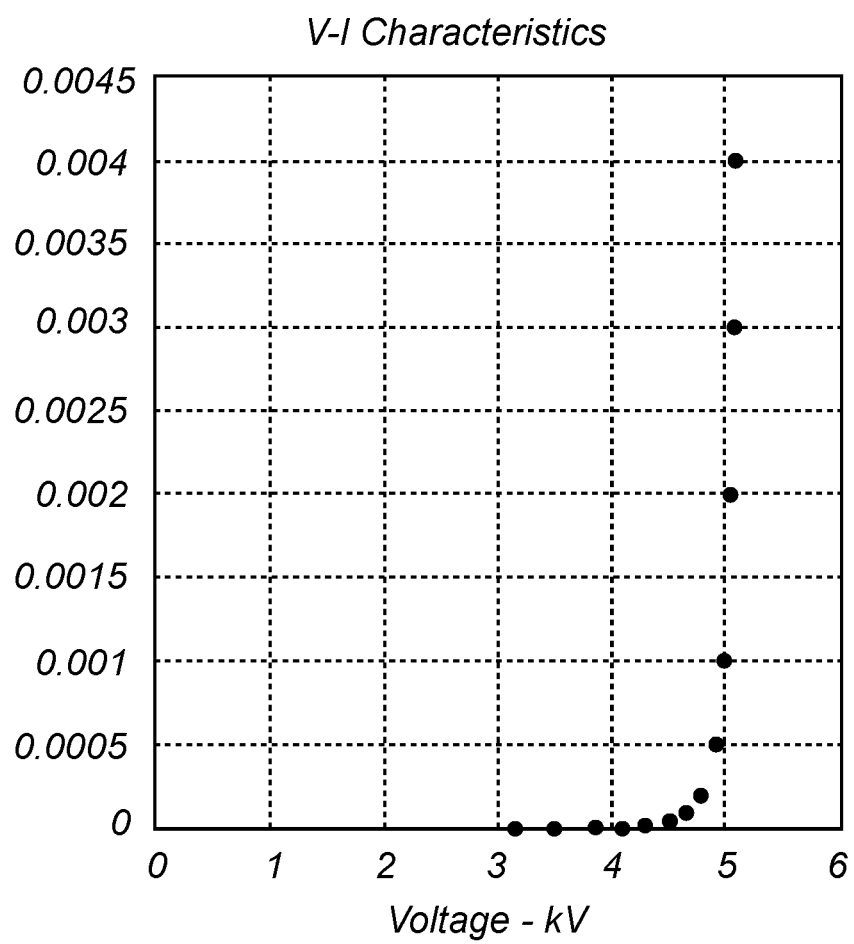
FIGS. 7A, 7B and 7C graphically represent the voltage-current characteristic, the voltage-temperature (surface temperature) characteristic and the voltage-power factor characteristic of a typical SVL, particularly illustrating the conduction transition region.
Figure 7B:
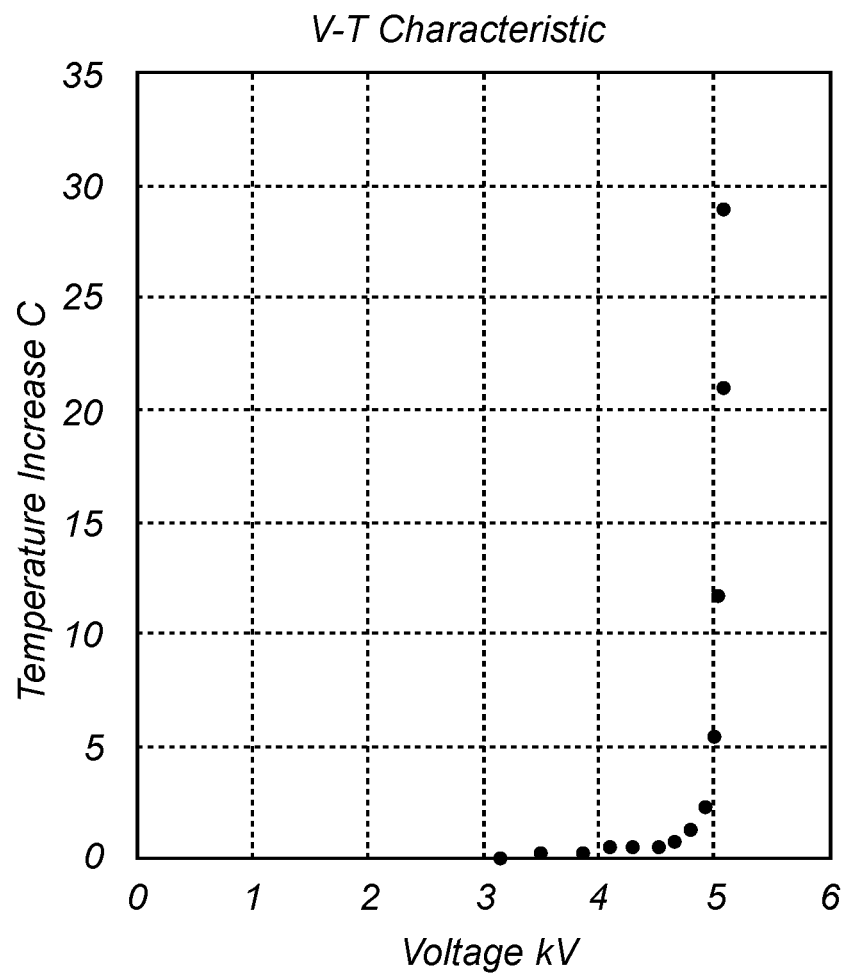

FIG. 7A illustrates the voltage-current (V-I) characteristic in the conduction transition region of a 3 kV rated SVL and FIG. 7B illustrates the voltage-surface temperature characteristic that occurs as a result of this SVL current. As shown, the relationship between the electrical and thermal energy curves are very similar. A properly functioning kV rated SVL is expected to follow these curves and its operability can be confirmed with an in-situ test which drives the SVL through its conduction threshold region while monitoring the resulting current or SVL surface temperature. SVLs that do not exhibit the expected conduction transition curves may be thought of as having poor operational integrity.

As shown in FIG. 4, a Hall effect device can be used as a sensor to provide a measurement of DC current flow through the SVL. A single Hall effect device 452a placed in the outgoing ground connection (FIG. 4C) inside the enclosure provides an acceptable DC current measurement; and other known current sensing devices can be used to provide information representing the current flowing through a respective SVL. However, the voltage-temperature relationship of the SVL proves to be more robust, easier, and less expensive to implement. For the 3 kV rated SVL represented in FIGS. 7A and 7B, DC voltages across the SVL below 4.5 kV are not expected to generate an appreciable surface temperature rise, while a DC voltage above 4.5 kV and approaching 5 kV would do otherwise.

Heretofore, out of service in-situ field maintenance inspection tests of link boxes require entry into the manhole in which the link box is located, and opening the link box for visual inspection by a technician. The present invention provides a significant improvement over current conventional practice and does not require entry into manholes and therefore provides utilities with a safe, low cost alternative to characterize the electrical behavior of an installed SVL and thus the functional reliability of the link box, including that installed SVL.

FIG. 8 is a simplified diagram illustrating how three "minor" shield sections 108a, 108b, 108c are connected in link boxes 314 and 815 to form one complete "major" cross-bonded shield section. FIG. 8 illustrates the linked connection of the shield segment 108a of phase A of high voltage conductor 104A to the shield segment 108b of phase B of high voltage conductor 104B by a connector link 318a in link box 314, and the connection of shield segment 108b to shield segment 108c of phase C of high voltage conductor 104C by a connector link 818b in link box 815. In this schematic illustration, each of the link boxes may be of the type shown in FIG. 3 and the connector links 318a and 818b may be of the type shown as the connector links 318 in FIG. 3. FIG. 8 also schematically illustrates an SVL 310a included in the link box 314 to provide a low resistance current path for shield bonding link 318a to ground when the voltage across SVL 310a exceeds its conduction threshold voltage. An SVL 810b included in the link box 815 provides a similar low resistance current path for shield bonding link 818b to ground. As is conventional, during normal operation shield segment 108a is connected to electrical ground at one point along the length of the shield, preferably at a point remote from and distant from link box 314. Likewise, during normal operation, shield segment 108c is connected to electrical ground at one point along its length, preferably at a point remote from and distant from link box 815. It should be noted that to simplify the drawing, only one of the three cross connections present in link box 314 and in link box 815 (as otherwise are present as shown in FIG. 3) are shown in FIG. 8.

FIG. 9 is a schematic illustration of one type of out-of-service maintenance inspection test procedure used heretofore. In this test, a segment of the shield, for example, shield segment 108a, normally connected to ground, is electrically disconnected from ground. Additionally, the point of shield segment 108c that normally is grounded is disconnected from ground, effectively isolating sections 108a, 108b and 108c from ground. In this test, a voltage source 924 is connected to shield segment 108c. In accordance with this test procedure, link boxes 314 and 815 are opened and SVLs 310a and 810b are disconnected from connector links 318a and 818b, thereby removing the current path to ground for shield segments 108a, 108b and 108c, via the connected SVLs which otherwise could potentially prevent test voltages supplied to the cable shield system from source 924 from reaching the desired test voltage level. Inasmuch as the SVLs are disconnected from the connector links, the SVLs are not subjected to the test voltage from source 924 and only the cable jacket and interrupting gaps are tested. Since they are not tested electrically, the SVLs are visually examined and either returned to service or exchanged with new SVLs following the maintenance test. In some cases, the SVL that is removed is subjected to laboratory bench tests and recycled if found to be functional.

In the foregoing maintenance test procedure, the test voltage, which preferably is a DC voltage, is increased, for example, in step-wise increments to the desired test level and maintained at that test level for a specified period of time, typically a few minutes. This places the voltage at the cable jackets and interrupting gaps associated with shield segments 108a, 108b and 108c at test voltage. After the test is completed the shield segments are reconnected to ground at the ends of segments 108a and 108c and another three segments (not shown) are isolated from ground and similarly tested.

This out-of-service maintenance test is essentially a dielectric withstand test of the cable jacket and interrupting gap that is conducted at a voltage test level above the rated voltage of the SVL and below the designed withstand level of the jacket and interrupting gap. As mentioned above, this test procedure requires each link box to be opened and each SVL to be disconnected, or removed, with the visual examination of the SVL and connecting hardware, namely, the connector links, bonding leads and bonding lead connectors of the link box. The SVLs in the link boxes may be separately and individually tested to evaluate their proper functioning. This requires specialized equipment and adds significant time to the inspection process. Moreover, the need to open and then reseal the link boxes may result in improper seals that eventually corrode and otherwise damage the components housed within those link boxes.

Figure 10:
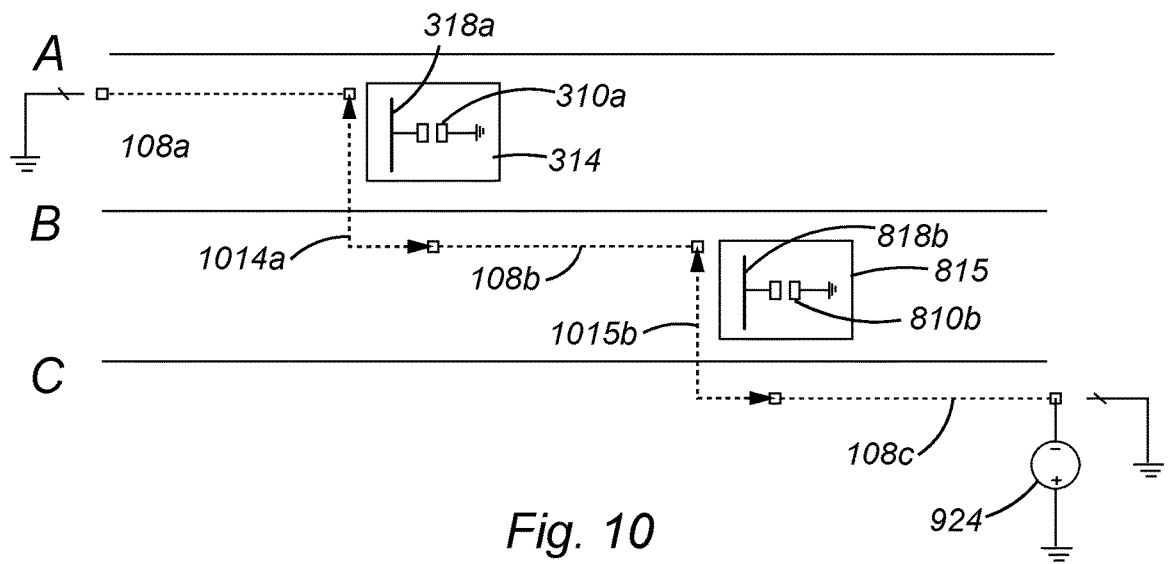
FIG. 10 schematically illustrates an alternate maintenance test configuration on a cross-bonded-shielding arrangement with three shield segments between the grounding points.

An alternative test arrangement heretofore used for testing the cable shield system connected to a link box having external bonding lead connections of the type shown in FIG. 3 is illustrated in FIG. 10, wherein link boxes 314 and 815 need not be opened for the test and the SVLs need not be disconnected from the connector links (as was the case in FIG. 9) for the application of a test voltage. In FIG. 10, the bonding leads 116a, 116b, 116c shown in FIG. 3 from the respective phases of the shield segments are disconnected from the bonding lead connectors 320a, 320b, 320c and the bonding leads 116'a, 116'b, 116'c are disconnected from the bonding lead connectors 320'a, 320'b, 320'c. Temporary jumpers 1014a and 1015b connect shield segments 108a, 108b and 108c, as shown, thus bypassing the link boxes 314, 815. As a result, the cable jacket and interrupting gaps of the three shield segments are tested together.

As was the case in FIG. 9, shield 108a, is electrically isolated from ground by disconnecting the point of this shield segment that normally is connected to ground. Also, the point of shield segment 108c that is remote from link box 815 and normally grounded is disconnected from ground and voltage source 924 is coupled to shield segment 108c. Voltage source 924 shown in FIG. 10 is the same as that illustrated in FIG. 9, typically a DC source, but can be an ac voltage source in either case The cable shield system schematically shown in FIG. 10 is tested in the same manner as previously described for the test procedure of FIG. 9. The test is performed by gradually increasing the test voltage supplied to the cable shield system by voltage source 924. Although this test configuration avoids the disadvantages associated with opening the covers of the link boxes 314 and 815, nevertheless a technician must enter the manholes in which the link boxes are located to disconnect the external bonding leads, apply the temporary jumpers and possibly, if the link box is provided with a transparent cover, perform a cursory visual inspection of the enclosed hardware including the SVL. After the test is performed, the temporary jumpers needed for testing are removed and the bonding leads reattached and resealed. This procedure is also time consuming and subject to error when reconnecting the bonding leads and reapplying the sealing materials to the link boxes.

The foregoing disadvantages and problems of the prior art are avoided by the present invention. One embodiment of the present invention for testing the functional reliability of the cable shield system has the test configuration schematically illustrated in FIG. 11. In this figure, the same reference numerals as used in FIG. 8 identify the same components. As shown, phase A shield 108a is connected by connector link 318a in link box 1114 to phase B shield 108b; and phase B shield 108b is connected by connector link 818b in link box 1115 to phase C shield 108c Link box 1114 includes an SVL 310a, a temperature sensor 1128a adapted to measure the surface temperature of SVL 310a, and a voltage sensor 1130a adapted to measure the voltage across the SVL 310a. Similarly, link box 1115 includes an SVL 810b, a temperature sensor 1128b and a voltage sensor 1130b. The temperature sensors preferably comprise heat sensors juxtaposed the SVLs and adapted to sense heat dissipated by the SVL. As mentioned, previously as the voltage across the SVL increases, the current through the SVL will increase linearly until the SVL conduction threshold voltage is reached. At that point an increase in voltage results in a disproportional increase in current through the SVL which, in turn, produces internal heating and an increase in the detectable SVL surface temperature.

In one embodiment, the heat sensors 1128a, 1128b comprise infrared (IR) sensors which detect the infrared radiation associated with the heat dissipated by the SVLs 310a and 810b. One example of a suitable IR sensor is a non-contact infrared sensor, such as Melexis model 90614, which produces a signal based on the heat radiated from the SVL surface. The detection of this SVL heating is measured as a change in surface temperature which occurs more rapidly when the applied voltage reaches and exceeds the conduction threshold of the SVL, as is normal and as represented by FIG. 7B. Detecting a surface temperature increase above ambient temperature is indicative that the SVL is operating above its conduction threshold, as might occur during abnormal in-service operation above the rating of the SVL, or during transient surges of higher voltage magnitude. As will be discussed, test voltages that are applied intentionally during out-of-service maintenance inspection testing are designed to cause a surface temperature rise. Such voltage and temperature characterization of the SVL, as sensed by the temperature and voltage sensors, is used to confirm the functionality of the cable shield system and the SVLs.

Voltage sensor 1130a measures the voltage that appears between connector link 318a and ground in link box 1114; and voltage sensor 1130b measures the voltage that appears between connector link 818b and ground in link box 1115. It is seen, the monitored voltages are the voltages sensed across SVLs 310a and 810b.

Figure 11:
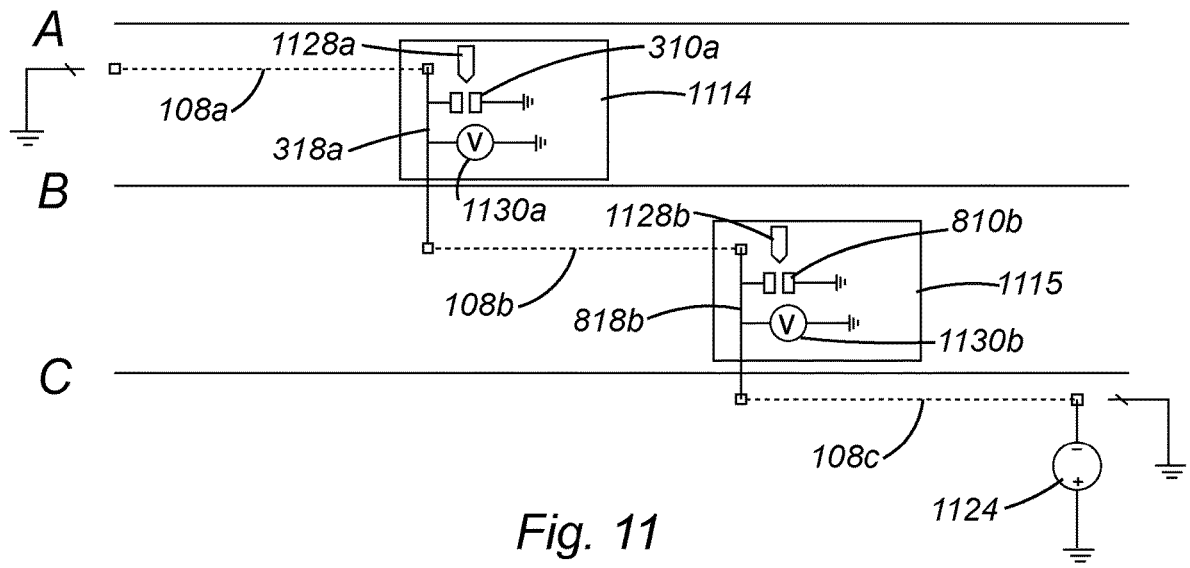
FIG. 11 is a simplified schematic illustration of an embodiment for testing cross-bonded shields in accordance with the present invention.

The technique for assessing the functional reliability of the cable shield system in accordance with the embodiment of the present invention shown in FIG. 11 now will be described. The connection of phase A shield segment 108a to ground is disconnected from ground and the connection of phase C shield segment 108c likewise is disconnected from ground, thereby isolating shield segments 108a, 108b and 108c from ground. A voltage source 1124 similar to voltage source 924 is connected to the isolated shield segments at any point but preferably at an accessible above grade location. In FIG. 11, voltage source 1124 is connected to shield segment 108c.

As previously described the voltage source is applied separately to each of, for example, three major sections with the two other sections grounded to extend the test to include the shield breaks and is to be applied sequentially and separately to all of the major sections.

In the embodiment wherein voltage source 1124 is a DC voltage source, the DC test voltage supplied by this source is gradually increased, such as in a step-wise manner. In one embodiment, the voltage source is controlled such that the DC voltage level supplied to the illustrated cable shield system is known, or predetermined, at each step. Alternatively, voltage source 1124 may be controlled by a processor to supply a gradually increasing DC voltage level instructed by that processor. For example, voltage source 1124 may be one of many commercially available units having enough power to increase the voltage on the cable shield circuit within a few minutes and support the current demand from SVLs that may be simultaneously driven into their conduction transition region. In an alternative, the voltage source may be an AC voltage source adapted to supply an AC test voltage to the cable shield system. If an AC test voltage is supplied, the current through and voltage across the SVL may not be in phase, as mentioned above. The phase angle between the SVL current and voltage is indicative of the impedance, and more particularly, the change in impedance as the SVL is driven into its conduction transition region. This phase angle may be measured; and the phase angle measurement provides voltage and current information supplied to the processing circuitry to determine the functional reliability of the cable shield system.

Figure 7C:
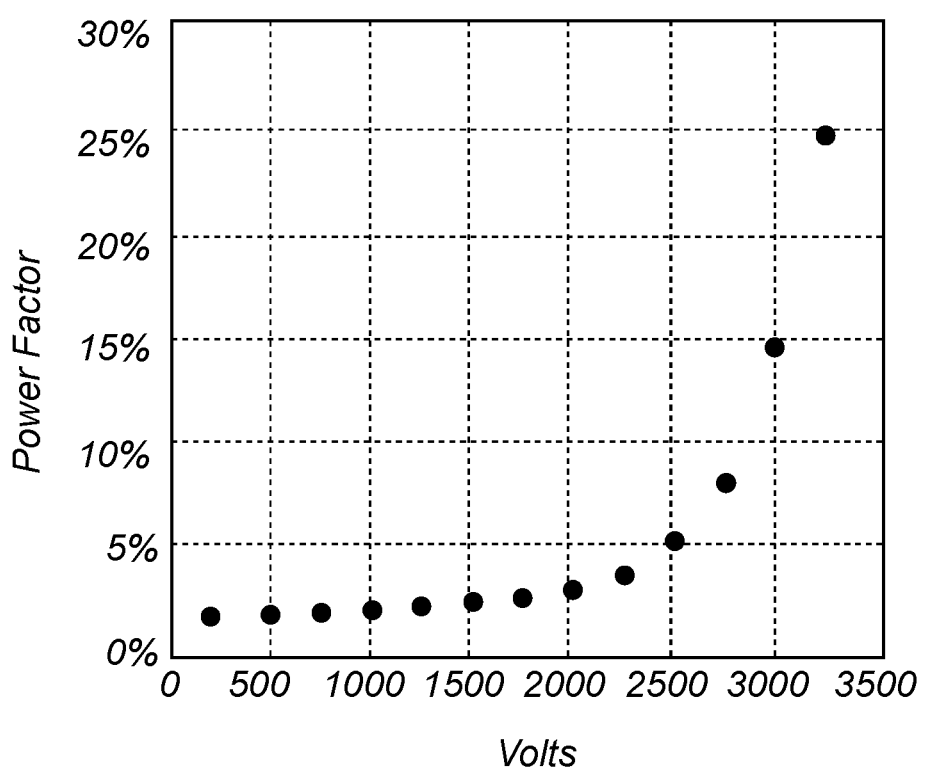

In one technique for measuring the phase angle between the SVL current and voltage, the zero crossing of the current flowing through the SVL is detected; and the zero crossing of the voltage across the SVL is detected. The time difference between such zero crossings represents the phase angle, or phase shift φ, between the current and voltage. This phase shift is proportional to the power factor $pf=\cos(\varphi)$, which increases as the SVL transcends into its conduction region. Accordingly, the power factor may be measured, or sensed, by detecting the time difference between the current and voltage zero crossings. FIG. 7C shows the power factor increase associated with the transition of the SVL from capacitive to resistive behavior. As seen from FIG. 7C, the voltage-power factor characteristic of the SVL is a good approximation of the voltage-current and voltage-temperature characteristic of the SVL.

As the test voltage increases, current flows from the voltage source 1124 through segment 108c to conductor link 818b to segment 108b to conductor link 318a to segment 108a in a manner that gradually increases the voltage in the cable shield segments and the connected SVLs. The voltage on link 318a may be measured locally in link box 1114 by voltage sensor 1130a and the voltage on link 818b may be measured by voltage sensor 1130b in link box 1115. The voltage-current characteristic of the SVL is nonlinear; and as the test voltage increases toward the SVL conduction threshold, current of increasing magnitude begins to flow. As the voltage across the SVL transcends into the conduction region the apparent resistance of the SVL decreases and the current through the SVL increases from microamps to milliamps. This increase in the SVL current results in an increase in the surface temperature of the SVL. Thus, monitoring or measuring the heat dissipated by the SVLs 310a and 810b in link boxes 1114 and 1115 by sensors 1128a and 1128b, respectively, provides a means to determine the functional reliability of the SVLs.

As discussed previously and shown graphically in FIG. 7A and FIG. 7B, the characteristic voltage-temperature (V-T) curve for the SVL closely resemble its characteristic voltage-current (V-I) curve. Accordingly, the heat information produced by sensors 1128a and 1128b are good representations of the current flowing in the SVLs. Likewise, the voltage-power factor curve for the SVL, shown in FIG. 7C, is a good representation of the SVL current as well as the heat dissipated by the SVL. Hence, in another embodiment, the temperature sensor 1128 may be replaced by the aforedescribed power factor sensor.

As mentioned above, the voltage-current (V-I) relationship or characteristic of a typical SVL can generally be found in the technical literature of the SVL manufacturer. A database referencing the V-I characteristics of different SVLs to the manufacturers and model numbers of those SVLs can be readily created from the literature or through simple laboratory tests of the conduction transition region of the SVLs. The V-I and V-T characteristics corresponding to specific SVLs may be stored in that database. When the cable shield system schematically illustrated in FIG. 11 is tested, the V-I characteristics of the SVLs 310a and 810b may be compared to the V-I characteristics stored in the database. If the V-I characteristics of the SVLs under test correspond (i.e. are very similar) to the known V-I characteristics stored in the database, the SVLs are functionally operable and recognized as "good." However, if the V-I characteristics of the SVLs under test differ from the V-I characteristics stored in the database, there is a clear indication of a degraded or failed system component and further diagnosis may be warranted. The cause of the abnormality, which may be a failed SVL, a shorted interrupting gap within the splice hardware or a damaged cable jacket may be determined by using the data collected from companion sensors in the link box, other link boxes on the circuit and from the voltage and current supplied by the test equipment connected to the shield system, e.g. the voltage source 1124. Furthermore, the voltage source can be connected at other locations of the major sections to bypass dielectric testing of the shield breaks and thereby isolate the anomaly to a defective or failed shield break. Thus, the functional reliability of the cable shield system may be determined easily and effectively, without requiring entry into the manholes and opening the link boxes therewithin.

Hence, the condition of the shield system is determined to be in a functional condition when the current through the SVL at the supplied test voltage is consistent with the predetermined V-I characteristic properties of the SVL; i.e., the current and test voltage exhibit a relationship that conforms to a predetermined reference relationship. Likewise, the condition of the shield system is determined to be a functional condition when the heat from the SVL at the supplied test voltage, as monitored by the temperature sensor, is consistent with the predetermined characteristics of the SVL. Stated otherwise, the condition of the shield system may be determined to be a fault or nonconformance condition when the heat from the SVL, as monitored by the sensors, is inconsistent with the expected behavior.

Figure 12:
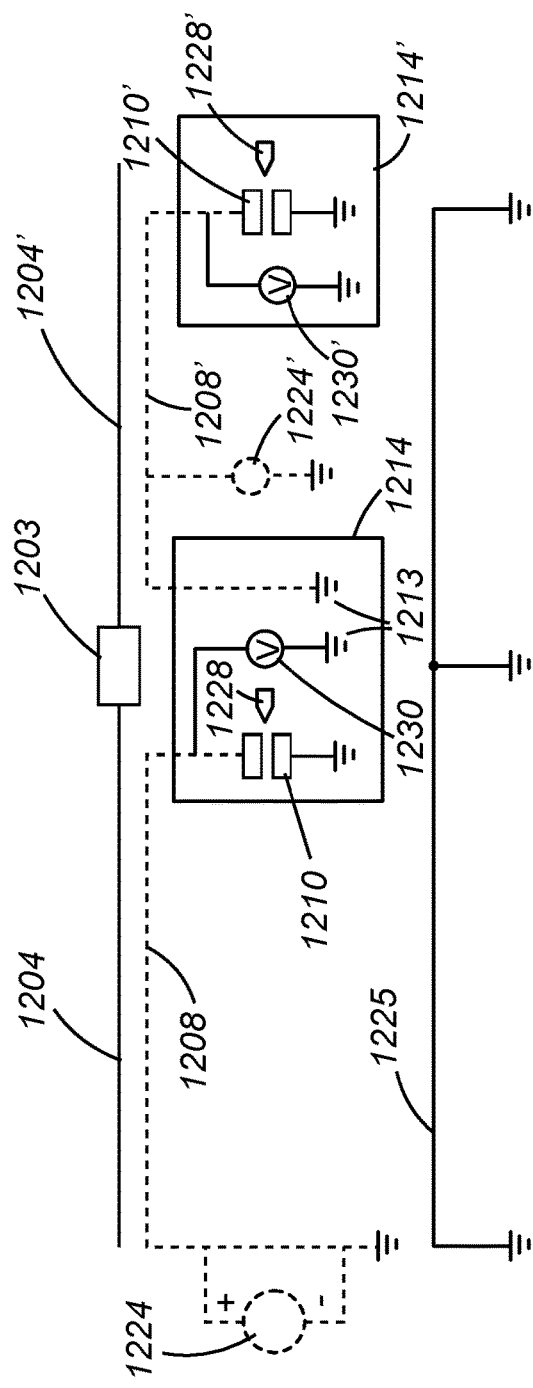
FIG. 12 is a simplified schematic illustration of the normal operating configuration of the cable shield system comprised of two single point grounded cable segments whose condition is evaluated in accordance with the present invention.
Figure 13:
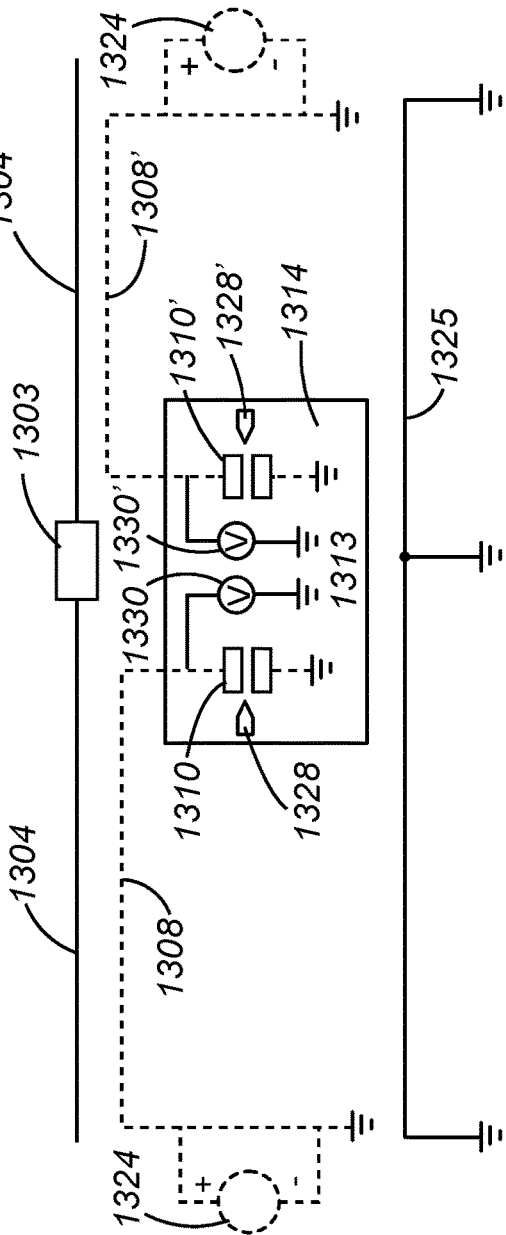
FIG. 13 is a simplified schematic illustration of yet another configuration of the normal operating configuration of the cable shield system comprised of two single point grounded cable segments whose condition is evaluated in accordance with the present invention.
Figure 14:
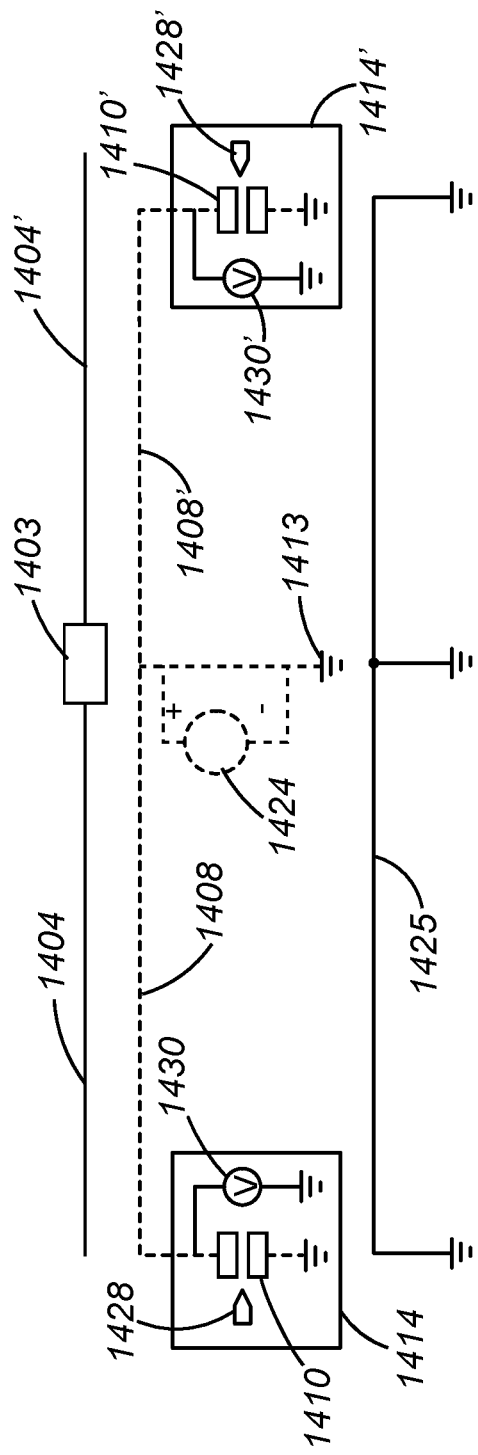
FIG. 14 is a simplified schematic illustration of a further configuration of the normal operating configuration of the cable shield system comprised of two single point grounded cable segments whose condition is evaluated in accordance with the present invention.

Embodiments utilizing the present invention can may include the shield bonding and grounding configurations described in connection with the schematic illustrations of FIGS. 12-14. FIGS. 12-14 illustrate a cable shield system comprised of one cable segment in which one end of the cable shield is grounded and the remote ungrounded end is connected to an SVL. FIG. 12 shows conductor cable segments 1204 and 1204' of a single phase (e.g. phase A) of a three phase high voltage cable joined in the splice hardware 1203. The splice hardware may be similar to splice 103 of FIG. 1. Cable segments 1204 and 1204' are surrounded by shields 1208 and 1208', similar to shields 108 and 108' of FIG. 1. One end, or point, of shield 1208 is connected directly to ground and the other and is coupled to ground by SVL 1210 included in housing 1214, which may be a link box, a ground box, or the like similar to FIG. 2. In this embodiment, link box, 1214 does not cross-link, or cross bond, shield segment 1208 to the shield segment 1208'. Rather, in this embodiment, housing 1214 includes a conductor that connects shield segment 1208' to ground 1213.

At its remote end, shield segment 1208' is connected to ground by SVL 1210' included in housing 1214'. Housing 1214' may be similar to housing 1214 and may include another conductor that connects another shield segment (not shown) to ground as is shown in FIG. 2. Additionally, as shown in FIG. 12, ground continuity conductor 1225 is installed to provide a path for fault current if and when present. One single ground continuity conductor may be installed for all phases (i.e. phases A, B and C). Due to the relatively close physical separation between cable phases and further separation of the ground continuity conductor, minimal current is induced in the ground continuity conductor and therefore there are no, or minimal additional heating losses to account for in the ratings of the high voltage cable.

The cable shield system illustrated in FIG. 12 is tested, in accordance with the present invention, to evaluate the functional reliability, or operational integrity, of the shield bonding and grounding system including the installed SVLs. To perform this maintenance test, the high voltage conductor 1204, 1204' is de-energized and the shield segment 1208 is isolated from ground by disconnecting from ground the point thereof that is remote from housing 1214. A voltage source 1224, shown in broken lines, such as the aforedescribed DC or AC voltage source, is connected to that point. It is appreciated, as the amplitude of the test voltage supplied by this voltage source increases to and above the conduction threshold voltage of SVL 1210, the amplitude of the current flowing through the SVL increases in the manner illustrated in FIG. 7A and this current flow causes the surface temperature of the SVL to increase as shown in FIG. 7B. Thus, increasing current through the SVL correlates well with an increase in surface temperature. A condition assessment of the SVL can be made by monitoring the current flow through the SVL, using a suitable current sensor, as the SVL voltage increases; or preferably by using temperature sensor 1228 to monitor the surface temperature increase of the SVL as the SVL voltage increases. The latter is a more robust and effective indicator of a fault condition or abnormality in the cable shield system, and in particular in the SVL 1210. The voltage, current and temperature information obtained during the maintenance test by the voltage sensor 1230, current sensor (not shown) and temperature sensor 1228, are utilized to evaluate the condition of the cable shield bonding and grounding system and in particular the functional reliability of the installed SVLs.

Similarly, shield segment 1208' and SVL 1210' are tested to evaluate their condition. Shield segment 1208' of the de-energized high voltage conductor is isolated from ground by disconnecting it from ground 1213 in housing 1214. Then, a voltage source 1224', shown in broken lines, such as the DC or AC voltage source discussed above, is connected to the isolated shield segment at any accessible location. It is appreciated, that there is no need to enter housing 1214 for the purpose of removing ground potential from segment 1208' as this can be done externally of the housing 1214 and sufficient clearances are provided to prevent flashover between the energized conductive components, such as the shields, and unenergized conductive components or surfaces. In this case any hardware connected to shield segment 1208' in housing 1214, such as metallic supporting structures, will be energized during the test.

As the test voltage supplied from source 1224' to segment 1208' increases, SVL surface temperature information from SVL 1210' is acquired by the temperature sensor 1228'. The resultant voltage-temperature characteristic of the SVL under test is compared with the voltage-temperature characteristic of a similar, functioning SVL on file in the database to determine the operational integrity of the SVL 1210'. Hence, a fault condition or abnormality in the cable shield system may be detected simply by comparing the voltage-temperature characteristics of the installed SVLs (e.g. SVL 1210, 1210') with those of a new SVL.

FIG. 13 and FIG. 14 are alternative shield grounding and bonding schemes for single point ground cable shields with ground continuity conductor 1325, 1425. The operation of these alternative schemes is substantially the same as the operation of the cable shield system of FIG. 12, with different locations of the ground and SVL connections. Nevertheless, during testing the same procedure discussed above is implemented: de-energizing the high voltage cable circuit, isolating the shield segment under test containing the SVL from ground, applying an increasing test voltage, and monitoring the SVL surface temperature.

FIG. 13 illustrates the configuration wherein segments 1304 and 1304' of a single phase of a three phase high voltage cable are joined in splice hardware 1303, similar to splice 103 of FIG. 1. Shield segments 1308 and 1308' of cable segments 1304 and 1304' are substantially the same as shield segments 1208 and 1208' of FIG. 12. The configuration shown in FIG. 13 differs from that shown in FIG. 12 in that shield segment 1308' is coupled to ground potential by SVL 1310' in housing 1314. The other end of segment 1308' that is remote from housing 1314 is connected to ground.

The cable shield system illustrated in FIG. 13 is tested by de-energizing the high voltage conductor and isolating (i.e. disconnecting) segments 1308 and 1308' from ground. A voltage source 1324, shown in broken lines, is connected to the isolated segment 1308 in place of ground and the test is performed. A separate voltage source 1324' or alternatively test voltage source 1324 is relocated to section 1308', and connected to the isolated segment 1308'. The shield segments 1308 and 1308' and SVLs 1310, 1310' connected thereto are tested in accordance with the procedure described above. Voltage and temperature information obtained during a test are used to determine the functional reliability of the shield bonding and grounding system.

FIG. 14 illustrates yet another single point grounding configuration in which segments 1404 and 1404' of a single phase of a three phase high voltage cable are joined in splice hardware 1403. Shield segments 1408 and 1408' of cable segments 1404 and 1404' are coupled in common to ground 1413, for example, at or near the location of the splice hardware. Points of the shield segments remote from the common ground connection are coupled to ground via SVLs 1410 and 1410' in housings 1414 and 1414', respectively. FIG. 14 also illustrates the ground continuity 1425 to provide a path for possible fault current.

The cable shield system of the FIG. 14 is tested by de-energizing the high voltage conductor and isolating shield segments 1408 and 1408' by disconnecting the shield segments from ground. A voltage source 1424 similar to the aforedescribed DC or AC voltage source, and shown in broken lines, is connected to the common connection of segments 1408 and 1408' in place of ground 1413. Alternatively, the voltage source can be connected to the isolated shield sections at any access point, including at link box 1414 or 1414' and, as mentioned, the ground 1413 is disconnected from the shield segments to isolate the shield segments for testing. The shield segments and SVLs connected thereto are tested in accordance with the procedure described above. SVL surface temperature and voltage information obtained during a test are utilized to detect a fault condition or abnormality in the cable shield system.

Although FIG. 14 describes a test procedure for testing both segments 1408 and 1408', as well as both SVLs 1410 and 1410' simultaneously, it will be appreciated that, if desired, the sections 1408 and 1408' can be tested independently.

Figure 15:
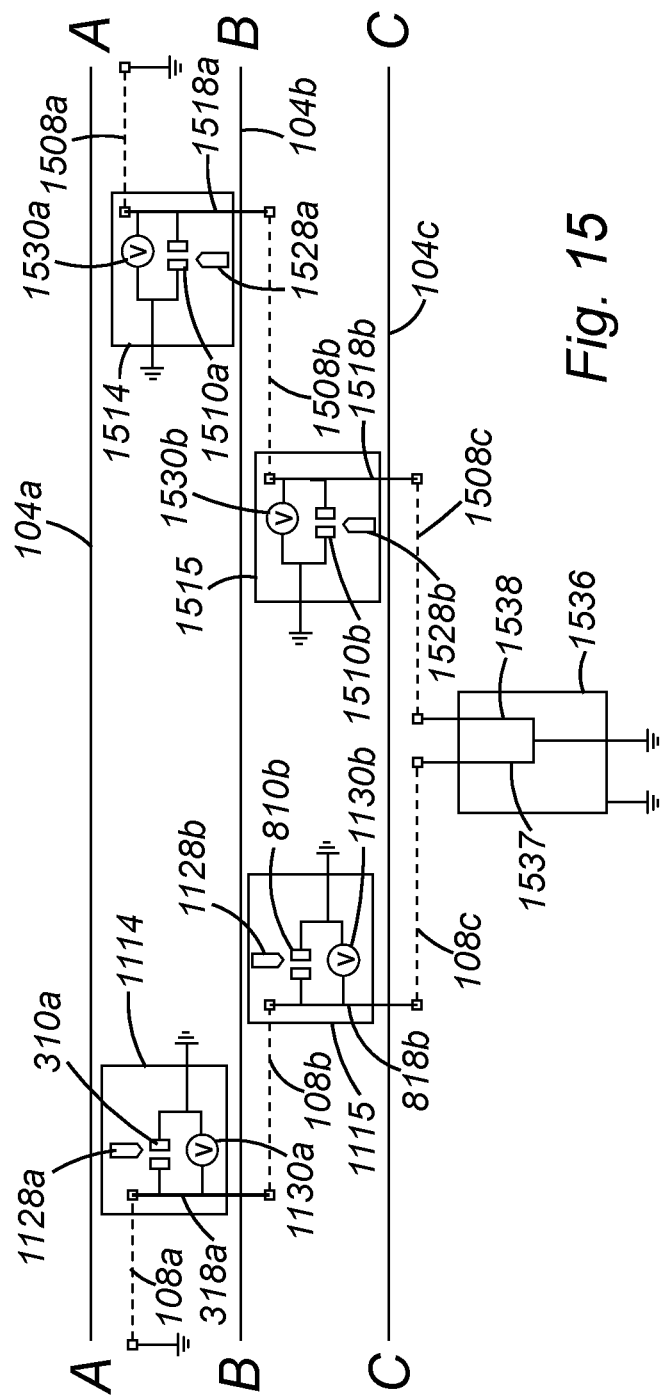
FIG. 15 is a simplified schematic diagram of a cable shield system containing more than three cross-bonded cable segments.

The foregoing discussion applies to link box applications associated with cross bonding and single point grounded cable shields. In practice, several cross-bonding and single point grounding configurations can be found along the circuit route, as when the circuit is comprised of more than three sections of cable due to practical length maximums. It is not uncommon to find a high voltage cable circuit 4 miles in length. With practical cable lengths typically on the order of 2000 feet, such circuits may include a plurality of major cross-bonded sections each comprised of three minor sections between a common grounding point, as described above and such as schematically illustrated in FIG. 15. The test arrangement discussed above can be applied to any number of sections as now described.

The configuration shown in FIG. 15 similar to that shown in FIG. 11, but FIG. 15 illustrates six segments of cable that utilizes two additional cross-link boxes 1514 and 1515 and one central grounding box 1536. This configuration accommodates a circuit length twice that of the configuration of FIG. 11 by coupling one cross-bonded circuit arrangement to another. Here, the point at which shield segment 108c is connected to electrical ground is through the grounding box 1536 that may be located in a manhole. As shown, a connector link 1537 within the grounding box physically connects segment 108c to ground. As an alternative, the grounding box 1536 may be omitted and the respective shield bonding leads may be connected directly to ground.

Grounding box 1536 also includes another connector link 1538 which physically connects a shield segment 1508c of high voltage cable 104c to electrical ground. Segment 1508c is similar to segment 108c and is, for example, the phase C shield of high voltage conductor 104c. In FIG. 15 segment 1508c is coupled to the phase B segment 1508b of conductor 104b via the connector link 1518b included in the link box 1515. Link box 1515 is similar to link box 1115 and includes an SVL 1510b, similar to SVL 810b, and a sensor 1528b, similar to sensor 1128b in link box 1115. Link box 1515 also includes a voltage sensor 1530b, similar to voltage sensor 1130b in FIG. 11, adapted to sense the voltage across SVL 1510b. In similar fashion, link box 1514 includes a connector link 1518a that electrically connects the phase B segment 1508b of high voltage conductor 104b to the phase A segment 1508a of high voltage conductor 104a. Link box 1514 is similar to link box 1114 and includes an SVL 1510a, similar to SVL 310a, and a sensor 1528a, similar to sensor 1128a in link box 1114. Link box 1514 also includes a voltage sensor 1530a, similar to voltage sensor 1130a in FIG. 11, adapted to sense the voltage across SVL 1510a. The outer ends of the phase A shield segments 108a and 1508a, remote from link boxes 1114 and 1514, respectively, are connected to electrical ground during normal operation.

Figure 16:
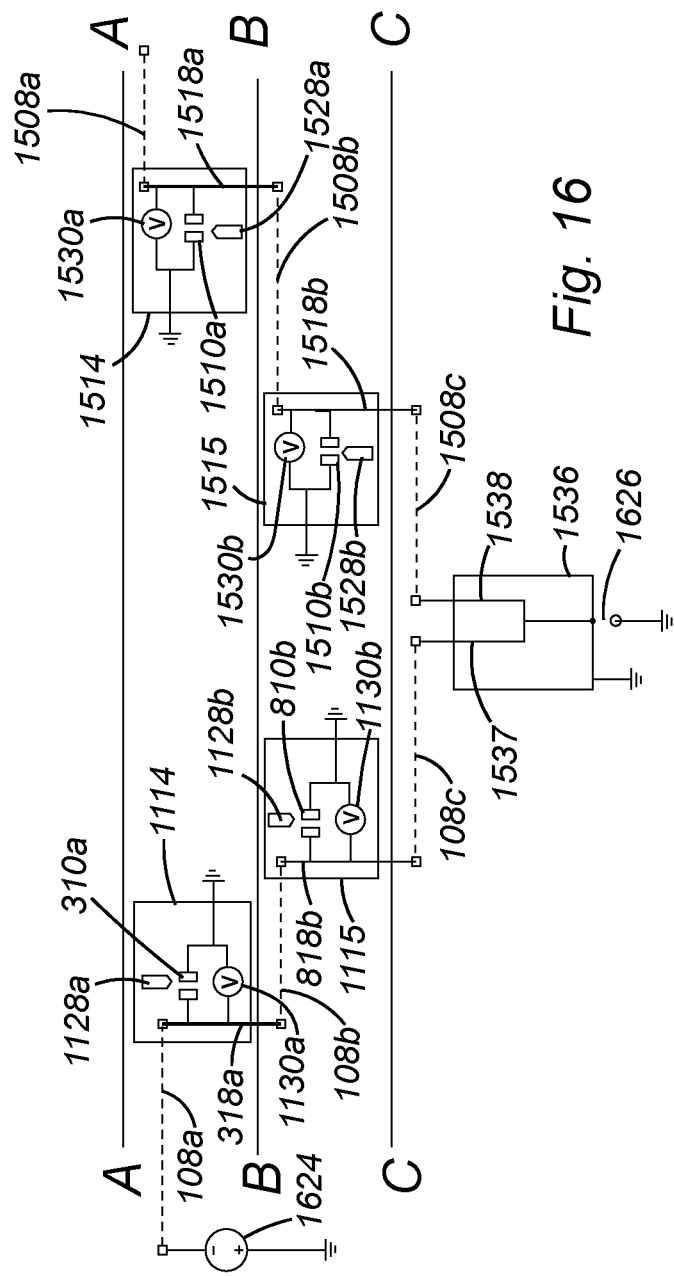
FIG. 16 is a simplified schematic diagram of an out of service maintenance test configuration for a cable shield system containing more than three cross-bonded cable segments.

The manner in which the cable shield system shown in FIG. 15 is tested in accordance with the present invention is schematically illustrated in FIG. 16. When the cable shield system of FIG. 15 is tested, the physical connection to electrical ground at the point along the circuit length of segment 108a remote from link box 1114 is disconnected from ground, as is the point along the circuit length of segment 1508a remote from link box 1514, thereby isolating segments 108a and 1508a from ground. Additionally, grounding box 1536, which during normal operation connects segments 108c and 1508c to ground, also is disconnected from ground to effectively isolate the shield segments electrically connected in link boxes 1114, 1115, 1514 and 1515 from ground, as shown at 1626. There may be no need to open housing 1536 for the purpose of removing the ground from connector links 1537 and 1538 because this can be done externally of the housing. In this embodiment connector links 1537 and 1538 are not commonly connected to other shield segments that may be grounded externally of housing 1536.

Thus, segments 108c and 1508c are electrically isolated from ground. Similar to the test configuration described above in connection with FIG. 11, the cable shield system of FIG. 16 can be tested from any convenient point. The test voltage is supplied by a voltage source 1624, which may be a DC source or an AC source similar to voltage source 1124 of FIG. 11, shown here to be connected at the terminal end of segment 108a. The test voltage is supplied with a gradually increasing amplitude to the electrically isolated end of segment 108a. The test voltage amplitude may be gradually increased in predetermined steps; or, alternatively, as a linearly increasing voltage.

Similar to the test configuration of FIG. 11, as the test voltage supplied by voltage source 1624 increases, the voltage on segment 108a, conductor link 318a, SVL 310a, segment 108b, conductor link 818b, segment 108c, conductor links 1537 and 1538, segment 1508c, conductor link 1518b, segment 1508b, conductor link 1518a and finally segment 1508a likewise increases. As the test voltage increases above the conduction threshold of the SVLs, current of increasing magnitude flows through the SVLs when the SVLs operate above the conduction threshold region. As represented by the SVL V-I characteristic of FIG. 7A, when the supplied test voltage exceeds the predetermined conduction threshold voltages of the SVL, the current through that SVL increases disproportionately. The heat dissipated by each SVL is related to the current flowing therethrough; and sensing this heat is a good approximation of the SVL current. Heat sensors 1128a and 1128b, which may be IR sensors, detect the heat dissipated by SVLs 310a, and 810b and sensors, 1528a and 1528b detect heat dissipated by SVLs 1510a and 1510b. Signals produced by the heat sensors thus constitute information representing the current flowing through the SVLs. The voltages across the SVLs are sensed by the voltage sensors 1130a, 1130b, 1530a, 1530b to produce information representing the voltages across the SVLs. This, voltage and heat (representative of current) information is acquired to assess the functional reliability of the cable shield system. The voltage source 1624 may be applied separately and sequentially to each isolated section while the other sections are grounded.

Figure 17:
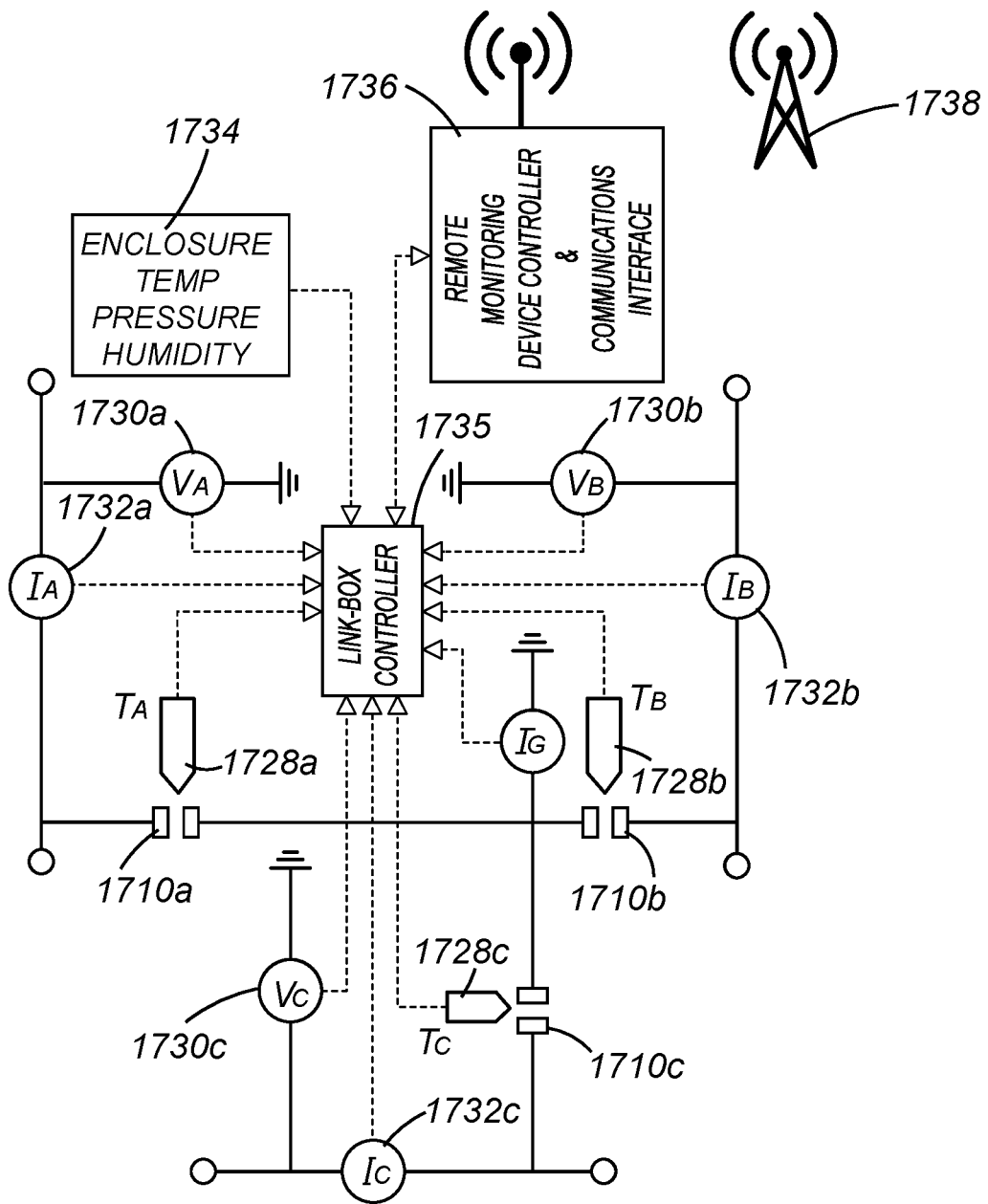
FIG. 17 is a schematic illustration of the embodiment of the present invention wherein the functional reliability of the cable shield system is evaluated at a remote location.

FIG. 17 is a schematic block diagram of a remote monitoring system for assessing the functional reliability of a cable shield system of the type discussed above, using the cross bonding configuration illustrated in FIG. 5, and including a package of link box sensors, including the sensors of, for example, FIG. 11 and environmental sensors. Voltages VA, VB and VC represent the voltages across SVLs 1710a, 1710b and 1710c sensed by voltage sensors 1730a, 1730b and 1730c, respectively. These voltage sensors may be similar to the voltage sensors 1130a and 1130b of FIG. 11. FIG. 17 also shows currents IA, IB and IC flowing through the connector links, as sensed by respective current sensors 1732a, 1732b and 1732c. The current sensors may be similar to current sensor 440a of FIG. 4A. FIG. 17 also depicts the surface temperatures Ta, Tb, and Tc of SVLs 1710a, 1710b and 1710c, as sensed by temperature sensors 1728a, 1728b and 1728c, respectively. Block 1734 represents the internal environmental sensors for monitoring the ambient conditions within the link box enclosure, such as ambient temperature, pressure and humidity within the housing. Other ambient conditions also may be monitored, as is known by those of ordinary skill in the art.

Voltage VA, VB and VC represent the voltages that are sensed, or monitored, across the SVLs. These voltages may be monitored periodically during normal in-service operation. Consistent with the present invention, the voltages across the SVLs can be continuously monitored during out-of-service maintenance testing of the cable shield system. As discussed above in connection with FIG. 11, the voltage sensors 1730 may comprise a resistive divider to reduce the higher voltages that are intentionally introduced during a maintenance test as well as high voltages which might occur in-service as a result of faults and surges. The resistive dividers reduce such SVL voltages to levels suitable for the processing circuitry, such as microprocessors. These over-voltage events should not cause the monitoring circuitry, including the sensors, to fail. Currents IA, IB and IC represent the current flowing in each conductor link in the cross bonded shield configuration shown in FIG. 11.

SVL surface temperatures Ta, Tb and Tc are sensed by temperature sensors 1728*a*, 1728*b* and 1728*c* and may be monitored periodically during normal in-service operation of the high voltage cable. Consistent with the present invention, the SVL surface temperatures are sensed during out-of-service maintenance testing. In one embodiment, the temperature sensors can be turned on, or activated, from their quiescent states in response to a command, such as a request for data, from the processing circuitry. Alternatively, the temperature sensors can be activated in response to signals generated by, or in response to, the voltage sensors and current sensors to detect and record SVL surface temperatures changes that occur during transient events when such sensed voltage and/or current exceeds a predetermined level.

The environmental conditions, such as ambient temperature, pressure and humidity, that exist within the enclosure housing also are monitored by sensors to sense and monitor for water ingress and high housing temperatures which may be indicative of defective seals and loose internal connections. The ambient temperature within the housing also provides a reference to which the SVL surface temperature rise can be compared.

In one embodiment, the signals produced by the sensors, for example, the current, voltage, temperature, pressure and humidity signals, are sent, by hard-wire, to a controller, referred to as a link box controller 1735, such as a microprocessor or other processing circuitry. The link box controller may store instructions, for example, for acquiring sensor information from the sensors at scheduled times. A store also may be provided in, or in the vicinity of the controller to store the sensor data. The sensor data can be stored in its original form, as received from the sensors, or reduced (e.g. compressed, such as statistically compressed) to conserve storage space. The link box housing also may house a battery that provides electrical power to the link box controller and the sensors. Data compression of the sensor data serves to conserve battery life. In a preferred embodiment, sensor data from the link box controller is transmitted wirelessly to a remote central location, for example, via a low-power wide-area network (LP-WAN) communications protocol. In another embodiment, the sensor data is transmitted via fiber optic cable to the remote location.

In another embodiment a remote monitoring device controller 1736 may be used as a control and communications interface between the link box and a central server. In one embodiment, the remote monitoring device controller includes a low-power wide-area network (LP-WAN) transmitter for wirelessly transmitting the sensor information to remote processing circuitry 1738. One example of a suitable low-power wide-area network is described in U.S. Pat. No. 10,607,475. Link box controller 1735 and remote monitoring device controller 1736 may be located in the same manhole. Alternatively, remote monitoring device controller 1736 may be disposed in a location separate from the location of the link box, such as in another underground location, to which the sensor information is supplied from the link box controller 1735.

Preferably, link box controller 1735 responds to instructions that may be received from remote processing circuitry 1738, periodically or from time to time, for measuring, calculating, comparing, storing and transmitting the sensor information such as voltage, current, and SVL temperature information, as well as environmental information, stored in the link box controller. It is appreciated, the received instructions seek to balance the competing need for data, used to evaluate the condition of the cable shield system (i.e. send the data when needed), against battery consumption especially during data transmission intervals.

In yet another embodiment, the processing circuitry included in the link box controller 1735 provides local processing and storage of the acquired sensor data including voltage, current and temperature to provide a historical data base for comparison to recently acquired data as a routine on board check for significant abnormalities that trigger notifications.

The sensor data may be uploaded to a central server operable to compile data from other link boxes on the same cable circuit from which operating anomalies that are difficult to identify locally may be determined, thereby enabling the assessment of the integrity of the shield bonding and grounding system of the circuit. For example, during normal operation, the current flowing in each of the linked cable shield segments of a cross bonded system will be the same. But any deviation would suggest an unintended current pathway or fault in the circuit.

The test procedure discussed above can be automated with SVL voltage and surface temperature fed back to the processing circuitry which controls the rate of voltage increase or decrease to account for the surface temperature changes detected for each of the SVLs. It will be appreciated, after the rise in the test voltage supplied by the voltage source discussed above, the voltage should decrease to permit the SVLs to cool over time. Feedback control of automation shortens the test period by allowing for higher initial rates of voltage increase which can be slowed when the test voltage approaches the SVL conduction threshold, thereby preventing overshoot and facilitating greater measurement repeatability of the voltage-temperature characteristic in the conduction transition region. Advantageously, temperature measurements from the sensors transmitted to the processing circuitry can be sent to test technicians in the field through computer connections or cell phone communication in near real time.

By sensing the SVL temperature and knowing the test voltage, the condition of the SVL, the cable jacket, the grounding system and the interrupting gaps in the splice hardware are readily detected to anticipate potential problems. For example; by supplying a variable DC test voltage to the cable shield system from the cable ends (at substations) the operability of the SVL is determined by sensing the SVL temperature rise as a function of the test voltage as the SVL current transcends the conduction threshold region. Accordingly, maintenance tests of the cable shield system are obtained that do not require manhole entry, disconnecting the cable bonding leads or opening the link boxes or other enclosures to remove the links for testing and maintenance.

Some practical diagnoses are derived from the present invention. For example, when the test voltage supplied to the SVL is below its conduction threshold and there is little or no heat dissipated by the SVL, but the SVL dissipates measurable heat when the test voltage exceeds the SVL conduction threshold, the gap, jacket, SVL and ground connections are determined to be in acceptable operating condition and no maintenance is required On the other hand, if no heat is detected from the SVL when the test voltage is above the SVL conduction threshold voltage, it may be determined that the interrupting gap and jacket are functioning properly, but most likely there is a problem with the SVL or associated ground connections. However, if significant heat dissipated by the SVL is detected when the test voltage is below the SVL conduction threshold voltage, most likely the condition of the interrupting gap and jacket is proper; but the SVL may be damaged or shorted, or an improper SVL is present.

As another example, if the current supplied by the test voltage source is at its maximum but the voltage across the SVL nevertheless does not reach or exceed the SVL conduction voltage and no heat is detected at the surface of the SVL, most likely the interrupting gap or the cable jacket are causing unexpected loading of the testing circuitry and a short circuit is suspected.

These examples are described in greater detail below, in conjunction with FIG. 18, which is a schematic illustration of the tests performed on a major section of the high voltage cable.

In the embodiment of FIG. 17, the link box controller 1735 can record (e.g. simply store) the sensor signals but not transmit the sensor data unless triggered by a sensor input that exceeds a predetermined level, for example, voltage data that exceeds a preset level. Such events differ from normal operation and are recognized as unscheduled data transmission events.

The recent history (e.g. several weeks) of the voltage, current, temperature and environmental information may be stored on board in the link box controller but long term history may be stored remotely, as in remote processing circuitry 1738, to represent the behavior of the high voltage power cable circuit and can be used to set control, notification and alarm points that are consistent with that long-term behavior. A data base of such information can include many parameters including specific details of the SVLs being monitored, such as manufacturing history and ratings.

Thus, it is seen the present invention provides system operators with a means and method to assess the functional reliability of the shield bonding and grounding system of the high voltage power cable circuits. The invention utilizes a set of sensors to collect data in remote locations, namely manholes, and transmit this information in near real time to a central server where it can be accessed for evaluating the electrical and environmental operating condition of the cable shield system. This information can be acquired when the cable circuit is out of service and subjected to the test protocol described herein.

Figure 18:
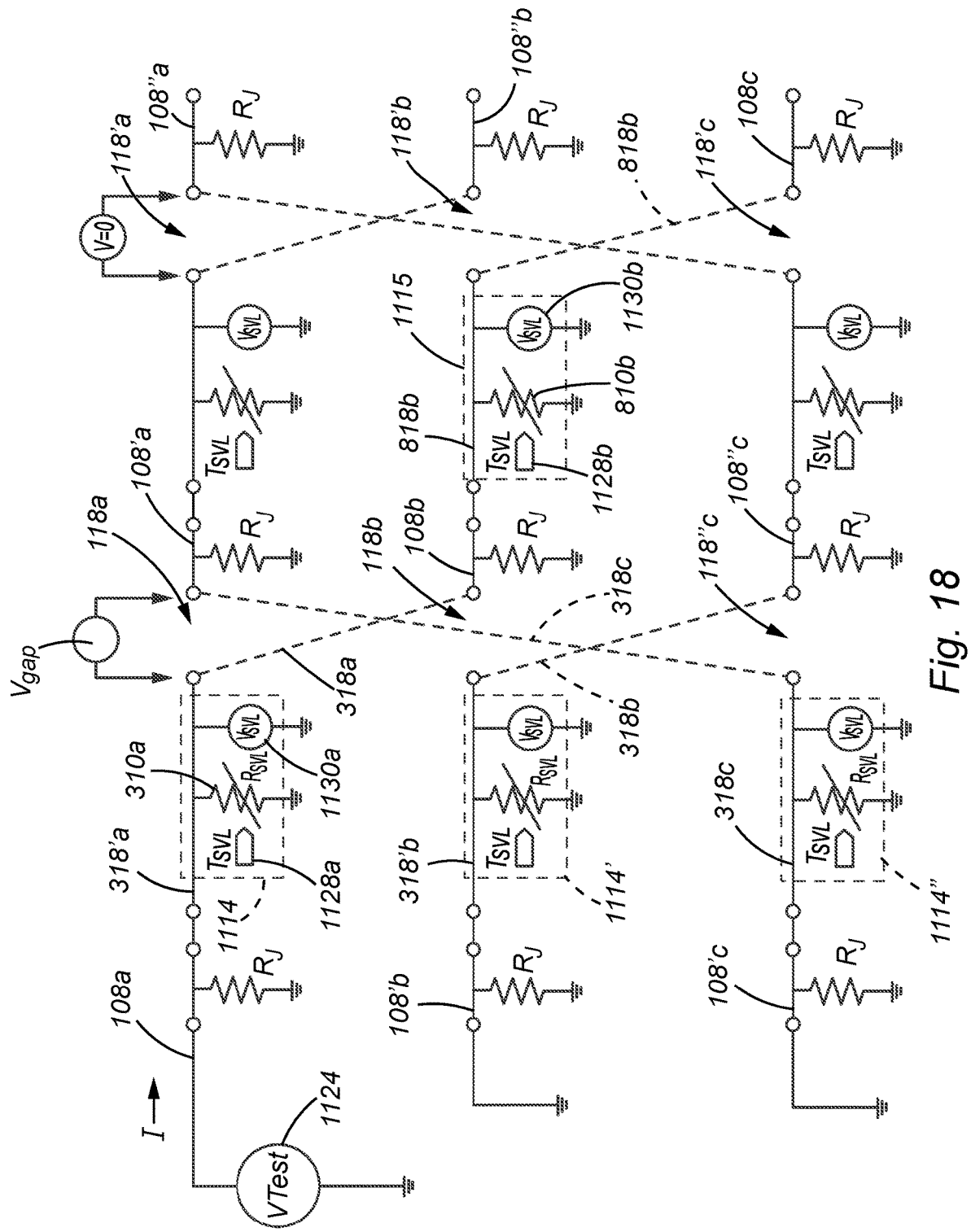
FIG. 18 is a schematic diagram of another out of service maintenance test configuration for a cable shield system with a major section including three minor sections.

Turning now to FIG. 18, wherein the reference numerals used in FIGS. 1 and 11 are used to identify like components, the test voltage source 1124 is coupled to cable shield segment 108$a$ and shield segments 108'$b$ and 108'$c$ are grounded, such as at their circuit ends. Although not shown, a conventional current meter, similar to aforedescribed current sensor 440 is coupled to the output of the voltage source to provide a measure of the current supplied to the cable shield segments by the voltage source. Connector link 318$a$ in link box 1114 cross-connects shield segment 108$a$ of phase A to shield segment 108$b$ of phase B and connector link 818$b$ in link box 1115 cross-connects shield segment 108$b$ to shield segment 108$c$ of phase C. These are the shield segments to be subjected to the test voltage. Link box 1114 may be of the type shown as link box 314 in FIG. 3 (or FIG. 5). Also in link box 1114 connector link 318$b$ cross-connects shield segment 108'$b$ of phase B to shield segment 108"$c$ of phase C; and connector link 318$c$, also in link box 1114, cross-connects shield segment 108'$c$ of phase C to shield segment 108'$a$ of phase A. FIG. 18 also illustrates shield interrupting gap 118$a$, present in the splice hardware that electrically isolates shield segment 108$a$ from shield segment 108'$a$ of phase A, shield interrupting gap 118$b$ present in the splice hardware that isolates shield segment 108$b$ from shield segment 108'$b$ of phase B, and shield interrupting gap break 118$c$ present in the splice hardware that isolates shield segment 108$c$ from shield segment 108'$c$ of phase C.

Since voltage source 1124 is connected to shield segment 108$a$ and shield segment 108'$c$ is grounded, the voltage Vgap across interrupting gap 118$a$, in the absence of anomalies, should be equal to the test voltage Vtest supplied by the voltage source. Likewise, connector link 318$a$ in link box 1114 couples the voltage Vtest at shield segment 108$a$ to shield segment 108$b$, while segment 108'$b$ is grounded, resulting in the voltage Vgap across interrupting gap 118$b$, in the absence of anomalies, equal to the test voltage Vtest supplied by the voltage source. Connector link 318$b$ in link box 1114 couples ground potential to shield segment 108"$c$ and, as mentioned, shield segment 108'$c$ is grounded, resulting in the voltage Vgap across interrupting gap 118$c$ of Vgap=0. It is appreciated, as a result of the connector links in link box 1115 coupling shield segment 108"$c$ which is at ground potential to shield segment 108"$a$ that the resulting potential at the interrupting gap Vgap isolating shield segment 108'$a$ from shield segment 108"$a$ will be zero. Furthermore in the absence of anomalies the potential that appears at the interrupting gap 118$b$ isolating shield segment 108$b$ from shield segment 108'$b$ and also the potential that appears at the interrupting gap 118$c$ isolating the shield segment 108'$c$ from shield segment 108"$c$ will be Vtest.

As illustrated in FIG. 18, a test whereby one connected group of three shield segments is isolated, for example, shield segments 108$a$, 108$b$, 108$c$, is tested with the remaining three-segment groups, shield segments 108'$b$, 108"$c$, 108"$a$ and shield segments 108'$c$, 108'$a$, 108"$b$, grounded provides a functional test of cable jackets, shield breaks and the SVLs associated with that isolated segments. The test procedure is repeated two more times, to isolate shield segments 108'$b$, 108"$c$, 108"$a$ and to isolate shield segments 108'$c$, 108'$a$, 108"$b$, with the non-isolated shield segments connected to ground.

As described above, included within each link box is an SVL, a temperature sensor and a voltage sensor. Link box 1114 is representative and, as shown, link box 1114 contains SVL 310$a$ (illustrated as a variable resistor), temperature sensor 1128$a$ and voltage sensor 1130$a$. Substantially the same components are associated with the other cross-linked shield segments in link box 1114 and in the other link box, such as link box 1115. Six examples of possible test results now will be described. It should be understood, however, the present invention is not limited solely to these examples and the test procedure described herein may be used for other examples of functionality.

Example 1: Shield segments 108'b and 108'c are grounded and a test voltage is supplied to shield segment 108a by voltage source 1124. The voltage which appears across the SVL 310a is measured in the link box by voltage sensor 1130a. The test voltage level is increased to a level Vthresh−, which is just below the conduction threshold voltage of the SVL 310a. This voltage appears across the cable jacket (the impedance of the cable jacket is identified in FIG. 18 as resistance Rj), the interrupting gaps (Vgap) and SVLs associated with (i.e. coupled to) the shield segments 108a, 108b and 108c. Accordingly, the cable jacket, interrupting gaps and SVLs are subjected to a dielectric withstand voltage test at this test voltage level Vthresh− for a specified period of time. At this voltage level the SVLs are not conducting; and the apparent resistance of each SVL is very high. The resulting current through the SVL is very small and not expected to cause heating of the SVL. Here, the temperature sensor detects no significant temperature, i.e. the temperature sensor 1128a detects ambient temperature, Assuming that the sensed SVL voltage $V_{SVL}$ is substantially equal to the test voltage Vthresh− and no temperature rise is detected at the surface of the SVL. the results of this first test example suggest that the cable jacket and interrupting gap are functionally operational and that the SVL is not shorted and has not prematurely entered its conduction transition region. Confirmation of the SVL functionality may be obtained by an additional test described below in Example 2.

Example 2: The test procedure of Example 1 is followed, but with a higher test voltage to drive the SVL into its conduction transition region, demonstrating that the SVL is functional. In Example 2 the test voltage supplied by voltage source 1124 is increased to a level Vthresh+ which is just above the SVL conduction threshold voltage, of the SVL 310a. As in Example 1, shield segments 108'b and 108'c are grounded. At this voltage Vthresh+ the apparent resistance of a properly functioning SVL decreases thereby drawing sufficient current from the test source 1124 which causes heating of the SVL, resulting in an increase in the surface temperature that is detected by temperature sensor 1128. Since higher current is drawn from the test source which supplies a test voltage above the conduction threshold voltage and the SVL surface temperature is above ambient, it may be concluded that the SVL is operating properly and there is no fault or defect in the interrupting gap 118a or cable jacket.

Example 3: Shield segments 108'b and 108'c are grounded and the test voltage supplied to shield segment 108a by voltage source 1124 is increased to the level Vthresh−, just below the conduction threshold voltage of the SVL 310a, as in Example 1. If the output current from the voltage source (as measured by the current meter, not shown) is much higher than would be expected by an SVL operating below its conduction threshold voltage Vthresh and the voltage sensor in the link box senses that the voltage across the SVL is substantially equal to the test voltage Vthresh level and the SVL surface temperature is sensed at, but not above ambient, this is indicative of a low resistance path to ground external to the SVL. This strongly suggest that the high current from the voltage source is caused by a defect in the jacket or interrupting gap.

Example 4: Shield segments 108a, 108'b and 108'c are all isolated from ground and connected in common; and the test voltage from source 1124, in this case Vthresh−, is supplied to the common-connected segments. As a result of all shield segments being at the same voltage, the voltage Vgap across all the interrupting gaps 118a, 118b, 118c and also the voltage appearing across interrupting gaps 118'a, 118'b, 118'c is zero. Since no current flows across the interrupting gaps, if no indication of surface temperature rise of the SVL is sensed, similar to that of Example 3, but if excessive current is drawn from the voltage source 1124, most likely there is a jacket defect. Alternatively, if the current drawn from source 1124 is consistent with that expected of a functional shielding system, for example, below the level at which the SVL conducts (Ithresh−), the defect is likely associated with one of the interrupting gaps Example 5: In the process of performing a test in accordance with Example 1, while raising the test voltage to Vthresh−, the current I is higher than expected for the voltage appearing across the SVL in the link box, that is, the voltage across the SVL is Vthresh−− (significantly below the conduction threshold voltage), and the current is Ithresh or above, and the surface temperature of the SVL is sensed to be above the ambient temperature of the link box. This suggests premature conduction of the SVL indicative of a damaged SVL or possibly an undersized SVL has been installed.

Example 6: In the process of performing the test in Example 2 while raising the test voltage to Vthresh++, significantly above the conduction threshold voltage of the SVL, the current I is much lower than expected for the voltage appearing across the SVL in the link box (e.g. I≤Ithresh−−) and the surface temperature of the SVL is substantially equal to ambient temperature in the link box. This suggests a damaged or improperly sized SVL having been installed.

Thus, it is appreciated, the installed sensors, test procedures and diagnostics can be used not only to evaluate the overall functionality of the cable shielding system but also isolate and locate defective or damaged components.

The foregoing examples are summarized in the following chart:

| Example | $V_{source}$ | $V_{gap}$ | I | $V_{SVL}$ | $T_{svl}$ | Possible Anomaly |
|---|---|---|---|---|---|---|
| 1 | $V_{Thresh(-)}$ | $V_{Thresh(-)}$ | $I_{Thresh(--)}$ | $V_{Thresh(-)}$ | $T_{Ambient}$ | None Apparent |
| 2 | $V_{Thresh(+)}$ | $V_{thresh}$ | $I_{Thresh(+)}$ | $V_{thresh}$ | $T_{Ambient(+)}$ | |
| 3 | $V_{Thresh(-)}$ | $V_{Thresh(-)}$ | $I_{Thresh(+)}$ | $V_{Thresh(-)}$ | $T_{Ambient}$ | Jacket or interrupting gap |
| 4* | $V_{Thresh(-)}$ | 0 | $I_{Threshold(+)}$ | $V_{Thresh(-)}$ | $T_{Ambient}$ | Jacket |
|  | $V_{Thresh(-)}$ | 0 | $I_{Thresh(-)}$ | $V_{Thresh(-)}$ | $T_{Ambient}$ | interrupting gap |
| 5 | $V_{Thresh(-)}$ | $V_{Thresh(--)}$ | $I_{Thresh}$ | $V_{Thresh(--)}$ | $T_{ambient(+)}$ | SVL |
| 6 | $V_{Thresh(++)}$ | $V_{Thresh(++)}$ | $I_{Thresh(--)}$ | $V_{Thresh(++)}$ | $T_{Ambient}$ | SVL |

−− Well Below
− Just Below
+ Just above
++ Well above
*Shield Segments 108a, 108'b and 108'c connected in common While the present invention has been shown and described with reference to preferred embodiments, it is to be understood that this invention is not limited to those precise embodiments. Other modifications and variations in form and details may be made by one of ordinary skill in the art without departing from the spirit and scope of the invention as define by the appended claims.

What is claimed is:

1. A method to test the functional reliability of a cable shield system for a high voltage cable circuit comprised of at least one segment along a cable route, the cable shield system including at least one segment of a conductive shield concentrically surrounding a phase of a corresponding segment of the high voltage cable circuit, the conductive shield extending along a circuit length and being physically connected to electrical ground potential during normal operation at least at one point along the circuit length, the conductive shield being connected at least at one ungrounded point via a connector link within a covered enclosure through a shield voltage limiter (SVL) to the electrical ground potential, the method comprising:
   electrically isolating a segment of the conductive shield from the electrical ground potential along the circuit length;
   supplying a test voltage of gradually increasing amplitude to the SVL;
   monitoring a voltage across the SVL and current through the SVL in response to the supplied test voltage; and
   determining the functional reliability of the cable shield system as a function of the monitored voltage across and current through the SVL.

2. The method of claim 1, wherein the voltage across and current through the SVL are monitored by sensors in the covered enclosure.

3. The method of claim 1, wherein the covered enclosure includes a heat sensor disposed to sense heat dissipated by the SVL; and wherein current flowing through the SVL is represented by detecting the dissipated heat.

4. The method of claim 1, wherein the functional reliability of the cable shield system is determined at a location remote from the covered enclosure by transmitting to the remote location information representing the voltage across and current through the SVL.

5. The method of claim 4, wherein the information representing the current through the SVL comprises heat information representing sensed heat dissipated by the SVL.

6. The method of claim 1, wherein the covered enclosure is a link box housing containing connector links for physically connecting the conductive shield of a respective phase of the high voltage cable circuit to the conductive shield of a different phase and to a respective SVL; and wherein the step of electrically isolating a segment of the conductive shield from the electrical ground potential comprises disconnecting the conductive shield from ground at all points of the segment of the cable shield section being tested.

7. The method of claim 6, wherein the cable shield system includes a first link box in which the conductive shield of a first phase of the high voltage cable circuit is electrically connected to the conductive shield of a second phase of the high voltage cable circuit, and a second link box in which the conductive shield of the second phase of the high voltage cable circuit is electrically connected to the conductive shield of a third phase of the high voltage cable circuit and wherein a point of the conductive shield of the first phase of the high voltage cable circuit distant from the first link box is physically connected to the electrical ground potential during normal operation and a point of the conductive shield of the third phase of the high voltage cable circuit distant from the second link box is physically connected to the electrical ground potential during normal operation; and wherein the step of electrically isolating a segment of the conductive shield from the electrical ground potential comprises disconnecting the distant points of the conductive shield of the first and third phases of the high voltage cable from ground.

8. The method of claim 7, wherein the step of supplying a test voltage to an end of the shield segment that has been isolated from the electrical ground potential comprises supplying a gradually increasing DC voltage to the end of the shield segment that has been isolated from the electrical ground potential.

9. The method of claim 7, wherein the step of supplying a test voltage to an end of the shield segment that has been isolated from the electrical ground potential comprises supplying a gradually increasing AC voltage to the end of the shield segment that has been isolated from the electrical ground potential.

10. The method of claim 9, wherein the current through the SVL exhibits a phase shift relative to the voltage across the SVL; and the step of monitoring the current through the SVL comprises monitoring the phase shift of the current relative to the voltage across the SVL.

11. The method of claim 10, wherein the phase shift of the current through the SVL relative to the voltage across the SVL is related to the power factor exhibited by the SVL, and the monitored phase shift is indicative of the functional reliability of the SVL.

12. The method of claim 4, wherein wireless transmission is used to transmit voltage and current information to the remote location from the covered enclosure.

13. The method of claim 12, wherein the wireless transmission comprises a low-power wide-area network (LP-WAN).

14. The method of claim 4, wherein a fiber optic cable is used to transmit voltage and current information to the remote location from the covered enclosure.

15. The method of claim 12, further comprising storing, in a store disposed in or in the vicinity of the covered enclosure, information representing the voltage across the SVL and heat information representing the sensed heat dissipated by the SVL; and transmitting the stored voltage and heat information via the LP-WAN in response to a instructions received from the remote location.

16. The method of claim 4, wherein the functional reliability of the cable shield system is determined to be a functional condition when the current through the SVL at the voltage across the SVL is consistent with predetermined characteristic properties of the SVL.

17. The method of claim 5, wherein the functional reliability of the cable shield system is determined to be a functional condition when the heat information from the SVL at the voltage across the SVL is consistent with predetermined characteristics of the SVL.

18. An evaluating system to test the functional reliability of a cable shield system for a high voltage cable circuit comprised of at least one segment along a cable route, the cable shield system including at least one segment of a conductive shield concentrically surrounding a phase of a corresponding segment of the high voltage cable the conductive shield extending along a circuit length and being physically connected to electrical ground potential during normal operation at least at one point along the circuit length, the conductive shield being connected to a link box that includes a connector link to electrically connect the conductive shield of one phase of the high voltage cable circuit through a shield voltage limiter (SVL) to the electrical ground potential, the evaluating system comprising:

a voltage source for providing, during a test, a test voltage of gradually or stepwise increasing amplitude;

a connector for supplying the test voltage from the voltage source to an end of the at least one segment of the conductive shield distant from the link box and that has been isolated from the electrical ground potential, thereby supplying a voltage across the SVL;

at least one sensor disposed within the link box for providing information representing the voltage across and current flowing in the SVL in response to the test voltage;

a transmitter for transmitting sensor information to a location remote from the link box; and a processor supplied with sensor information from the link box acquired during the test for determining the functional reliability of the cable shield system as a function of the voltage and the current information.

19. The evaluating system of claim 18, wherein current increases through the SVL disproportionally when the voltage across the SVL exceeds a conduction voltage threshold.

20. The evaluating system of claim 18, wherein the at least one sensor includes a heat sensor disposed to sense heat dissipated by the SVL; and the current information is represented by the sensed heat.

21. The evaluating system of claim 18, wherein the voltage source provides a gradually increasing DC voltage to an isolated shield segment.

22. The evaluating system of claim 18 wherein the voltage source provides a gradually increasing AC voltage to an isolated shield segment.

23. The evaluating system of claim 22, wherein the current through the SVL exhibits a phase shift relative to the voltage across the SVL; and the sensors include circuitry for sensing the phase shift of the current relative to the voltage across the SVL and as an indication of the functional reliability of the SVL.

24. The evaluating system of claim 18, wherein the transmitter comprises a wireless transmitter.

25. The evaluating system of claim 24, wherein the wireless transmitter comprises a low-power wide-area network (LP-WAN).

26. The evaluating system of claim 18, wherein the transmitter comprises a fiber optic transmitter.

27. The evaluating system of claim 24, further comprising a store disposed in or in the vicinity of the link box to store the sensor and voltage information, and wherein the transmitter wirelessly transmits the sensor and voltage information.

28. The evaluating system of claim 18, wherein the processor determines a functional condition of the shield system when the sensor information at the voltage across the SVL is consistent with predetermined characteristic properties of the SVL.

29. The evaluating system of claim 18, wherein the processor determines a nonfunctional condition of the shield system when the sensor information is less than a predetermined amount when the voltage across the SVL exceeds a conduction voltage threshold.

30. The evaluating system of claim 20, wherein the processor determines a nonconformance condition of the shield system when the sensed heat is more than a predetermined amount when the voltage across the SVL is less than a conduction voltage threshold.

* * * * *